United States Patent
Chen et al.

(10) Patent No.: US 11,935,932 B2
(45) Date of Patent: Mar. 19, 2024

(54) SEMICONDUCTOR DEVICE AND METHOD

(71) Applicant: Taiwan Semiconductor Manufacturing Company, Ltd., Hsinchu (TW)

(72) Inventors: Chun-Han Chen, Changhua (TW); Chen-Ming Lee, Yangmei (TW); Fu-Kai Yang, Hsinchu (TW); Mei-Yun Wang, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/870,170

(22) Filed: Jul. 21, 2022

(65) Prior Publication Data
US 2022/0359688 A1  Nov. 10, 2022

Related U.S. Application Data

(62) Division of application No. 16/844,405, filed on Apr. 9, 2020, now Pat. No. 11,489,053.

(51) Int. Cl.
| | |
|---|---|
| *H01L 29/417* | (2006.01) |
| *H01L 21/8238* | (2006.01) |
| *H01L 27/092* | (2006.01) |
| *H01L 29/40* | (2006.01) |
| *H01L 29/66* | (2006.01) |
| *H01L 29/78* | (2006.01) |

(52) U.S. Cl.
CPC .......... *H01L 29/41791* (2013.01); *H01L 21/823814* (2013.01); *H01L 21/823821* (2013.01); *H01L 21/823871* (2013.01); *H01L 27/0924* (2013.01); *H01L 29/401* (2013.01); *H01L 29/41775* (2013.01); *H01L 29/66795* (2013.01); *H01L 29/785* (2013.01)

(58) Field of Classification Search
CPC ... H01L 29/0649–0653; H01L 29/4991; H01L 29/515; H01L 2221/1042–1047
See application file for complete search history.

(56) References Cited

U.S. PATENT DOCUMENTS

| | | | |
|---|---|---|---|
| 7,834,345 B2 | 11/2010 | Bhuwalka et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |

(Continued)

FOREIGN PATENT DOCUMENTS

| | | |
|---|---|---|
| CN | 101667595 A | 3/2010 |
| CN | 108257871 A | 7/2018 |

(Continued)

*Primary Examiner* — Bac H Au
(74) *Attorney, Agent, or Firm* — Slater Matsil, LLP

(57) ABSTRACT

In an embodiment, a device includes: a gate electrode; a epitaxial source/drain region adjacent the gate electrode; one or more inter-layer dielectric (ILD) layers over the epitaxial source/drain region; a first source/drain contact extending through the ILD layers, the first source/drain contact connected to the epitaxial source/drain region; a contact spacer surrounding the first source/drain contact; and a void disposed between the contact spacer and the ILD layers.

20 Claims, 24 Drawing Sheets

(56) References Cited

U.S. PATENT DOCUMENTS

| | | |
|---|---|---|
| 9,576,814 B2 | 2/2017 | Wu et al. |
| 9,608,065 B1 | 3/2017 | Bergendahl et al. |
| 9,716,158 B1 | 7/2017 | Cheng et al. |
| 9,831,183 B2 | 11/2017 | Lin et al. |
| 9,859,386 B2 | 1/2018 | Ho et al. |
| 10,121,675 B2 | 11/2018 | Lee et al. |
| 10,236,358 B1 | 3/2019 | Patil et al. |
| 10,573,724 B2 | 2/2020 | Cheng |
| 10,700,180 B2 | 6/2020 | Chen et al. |
| 10,937,884 B1 | 3/2021 | Wang et al. |
| 11,121,236 B2 | 9/2021 | Wu et al. |
| 2002/0090791 A1 | 7/2002 | Doyle et al. |
| 2008/0265330 A1 | 10/2008 | Gerhardt et al. |
| 2011/0281413 A1 | 11/2011 | Zhong et al. |
| 2012/0276711 A1 | 11/2012 | Yoon et al. |
| 2015/0243544 A1 | 8/2015 | Alptekin et al. |
| 2016/0163816 A1 | 6/2016 | Yu et al. |
| 2016/0293715 A1 | 10/2016 | Zang |
| 2016/0365426 A1 | 12/2016 | Ching et al. |
| 2017/0125284 A1 | 5/2017 | Cheng et al. |
| 2018/0082951 A1 | 3/2018 | Li et al. |
| 2018/0166553 A1 | 6/2018 | Lee et al. |
| 2018/0182845 A1 | 6/2018 | Seong et al. |
| 2019/0043959 A1 | 2/2019 | Lee et al. |
| 2019/0131399 A1 | 5/2019 | Liu et al. |
| 2019/0148226 A1 | 5/2019 | Yim et al. |
| 2019/0181223 A1 | 6/2019 | Tang |
| 2019/0287849 A1 | 9/2019 | Wiseman et al. |
| 2019/0296123 A1 | 9/2019 | Lee et al. |
| 2019/0334008 A1 | 10/2019 | Chen et al. |
| 2019/0334011 A1 | 10/2019 | Cheng et al. |
| 2020/0020776 A1 | 1/2020 | Yang et al. |
| 2020/0035804 A1 | 1/2020 | Chen et al. |
| 2020/0075596 A1 | 3/2020 | Shin et al. |
| 2020/0105867 A1 | 4/2020 | Lee et al. |
| 2020/0105896 A1 | 4/2020 | Ando et al. |
| 2020/0126843 A1 | 4/2020 | Tsai et al. |
| 2020/0127109 A1 | 4/2020 | Wang et al. |
| 2020/0388694 A1 | 12/2020 | Cheng et al. |
| 2021/0083114 A1 | 3/2021 | Wang et al. |
| 2021/0249519 A1 | 8/2021 | Yao et al. |

FOREIGN PATENT DOCUMENTS

| | | |
|---|---|---|
| CN | 110098175 A | 8/2019 |
| CN | 110660845 A | 1/2020 |
| KR | 20120121795 A | 11/2012 |
| KR | 20180068846 A | 6/2018 |
| KR | 20190013342 A | 2/2019 |
| KR | 20190049331 A | 5/2019 |
| KR | 20190056163 A | 5/2019 |
| KR | 20190109187 A | 9/2019 |
| KR | 20200027817 A | 3/2020 |
| TW | 201834079 A | 9/2018 |

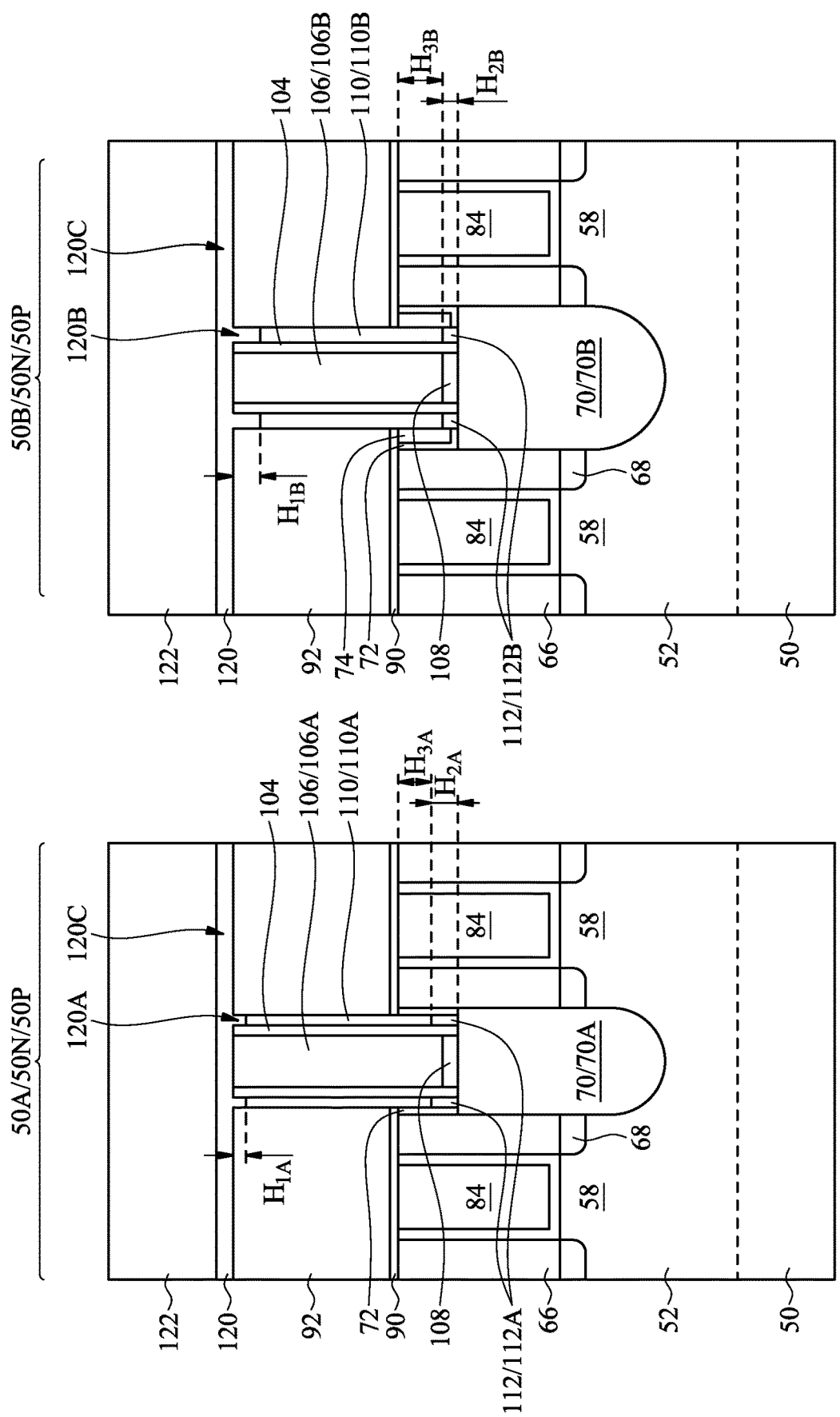

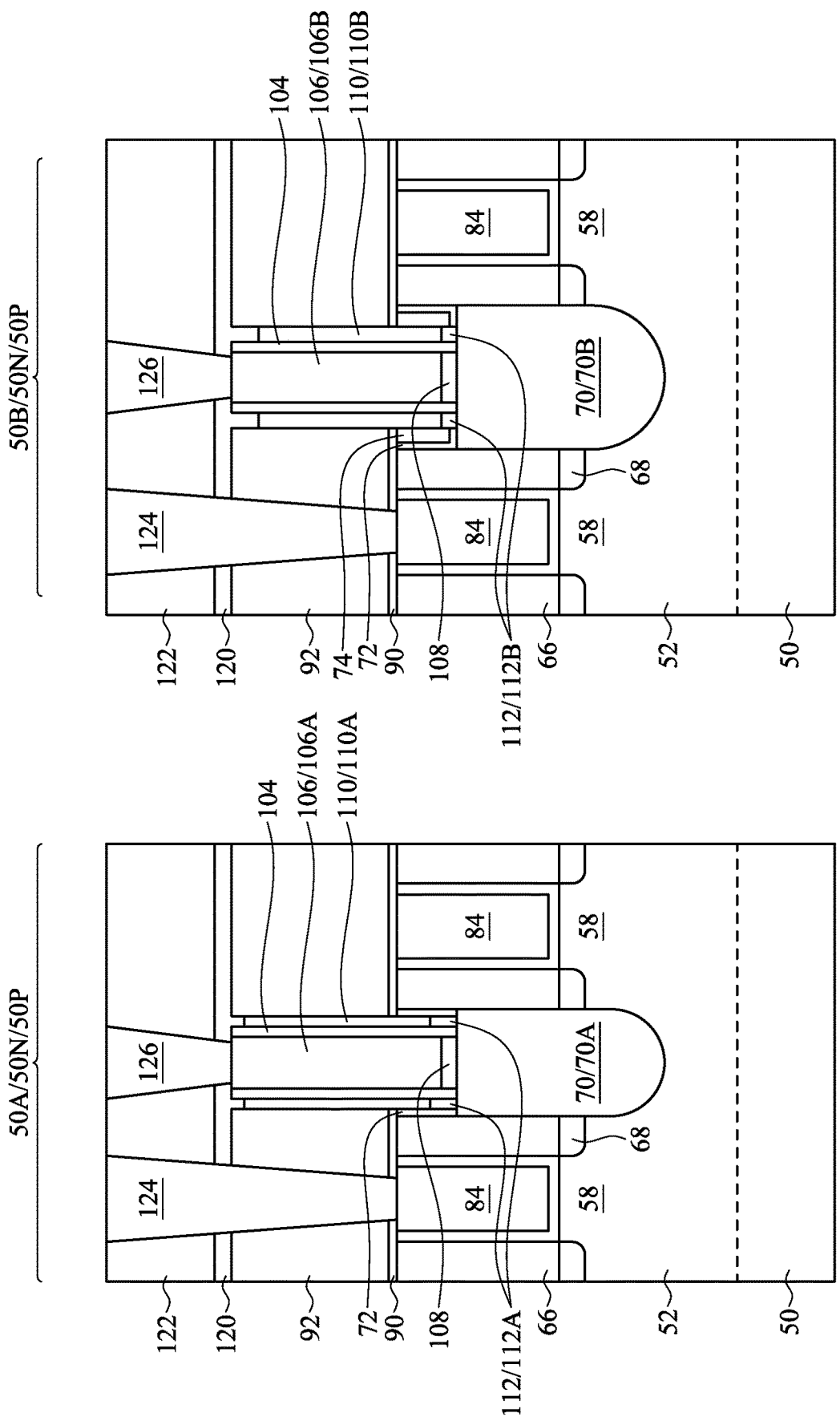

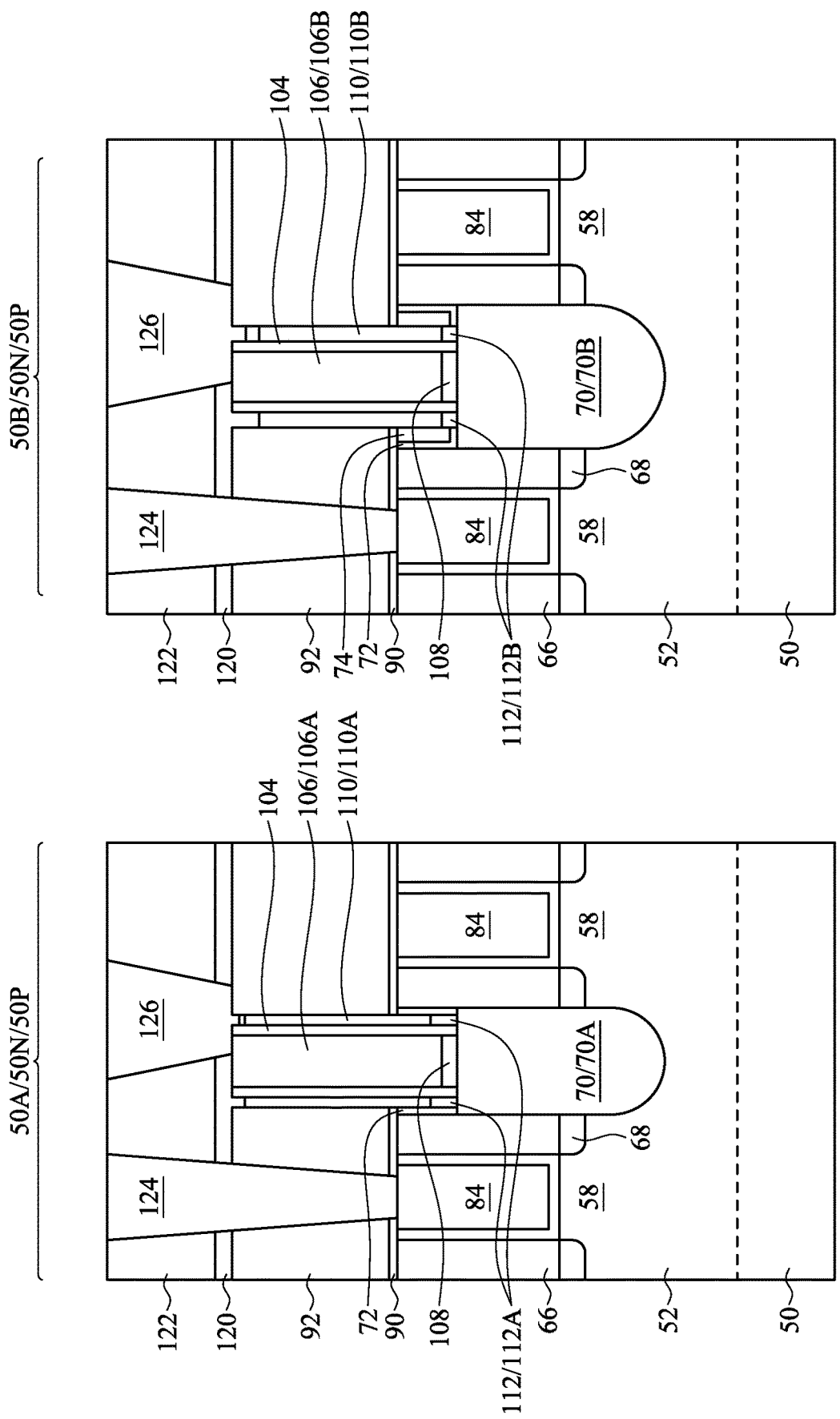

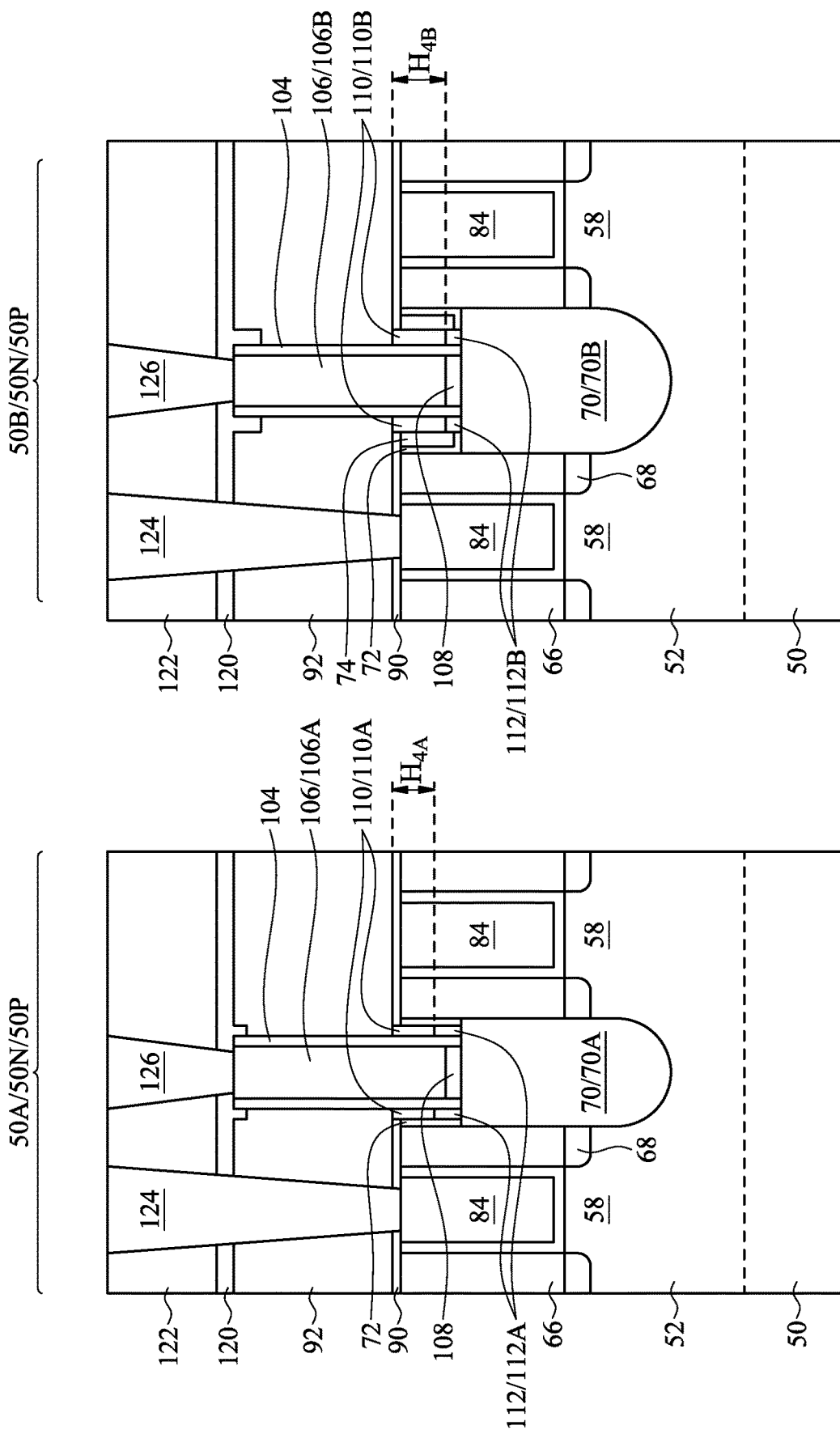

SEMICONDUCTOR DEVICE AND METHOD

PRIORITY CLAIM AND CROSS REFERENCE

This application is a division of U.S. patent application Ser. No. 16/844,405, filed on Apr. 9, 2020, entitled "Semiconductor Device and Method," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A through 18D are cross-sectional views of further intermediate stages in the manufacturing of FinFETs, in accordance with some embodiments.

FIGS. 19A through 20B are cross-sectional views of intermediate stages in the manufacturing of FinFETs, in accordance with some other embodiments.

DETAILED DESCRIPTION

Figure 1:
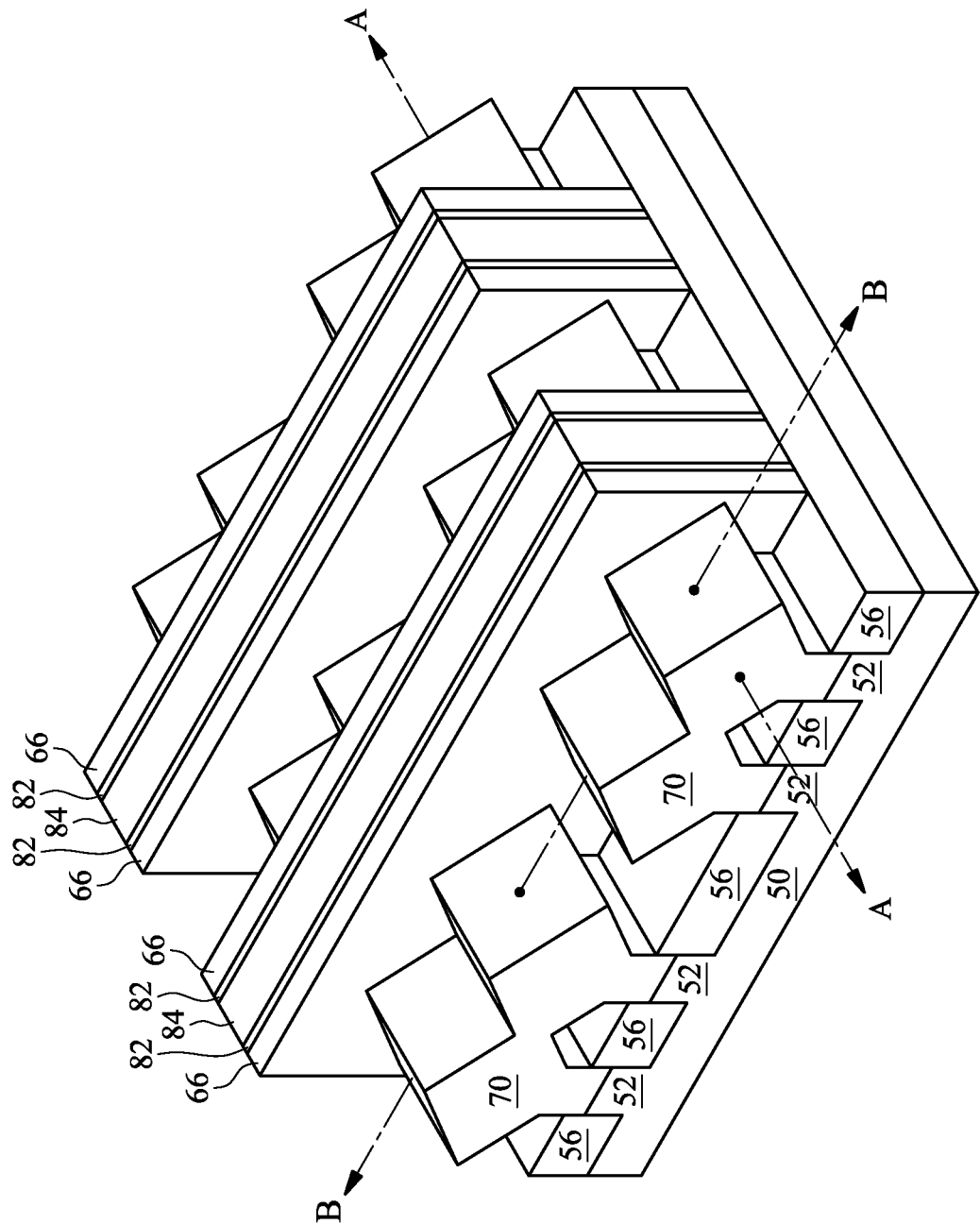
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, contacts are formed to source/drain regions of different widths. Openings for the source/drain contacts are formed, and sacrificial spacers are formed in the openings. The sacrificial spacers are formed by a deposition process having low uniformity, and so the sacrificial spacers reduce the variation in the widths of the source/drain contact openings. After the source/drain contacts are formed, the sacrificial spacers are removed to form voids surrounding the source/drain contacts.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors. The FinFETs comprise fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refer to the portions extending between the neighboring STI regions 56.

Gate dielectrics 82 are along sidewalls and over top surfaces of the fins 52, and gate electrodes 84 are over the gate dielectrics 82. Source/drain regions 70 are disposed in opposite sides of the fins 52 with respect to the gate dielectrics 82 and gate electrodes 84. Gate spacers 66 separate the source/drain regions 70 from the gate dielectrics 82 and gate electrodes 84. One or more inter-layer dielectric (ILD) layer(s) (not shown, discussed further below) are disposed over the source/drain regions 70 and gate electrodes 84, and contacts (not shown, discussed further below) to the source/drain regions 70 and gate electrodes 84 are formed through the ILD layer(s). In embodiments where multiple transistors are formed, the source/drain regions 70 may be shared between various transistors. In embodiments where one transistor is formed of multiple fins 52, neighboring source/drain regions 70 may be electrically connected, such as through coalescing the source/drain regions 70 by epitaxial growth, or through coupling the source/drain regions 70 with a same source/drain contact.

FIG. 1 further illustrates several reference cross-sections. Cross-section A-A is along a longitudinal axis of a fin 52 and in a direction of, for example, a current flow between the source/drain regions 70 of the FinFETs. Cross-section B-B is perpendicular to cross-section A-A and extends through the source/drain regions 70 of the FinFETs. Subsequent figures refer to these reference cross-sections for clarity.

Figure 2:
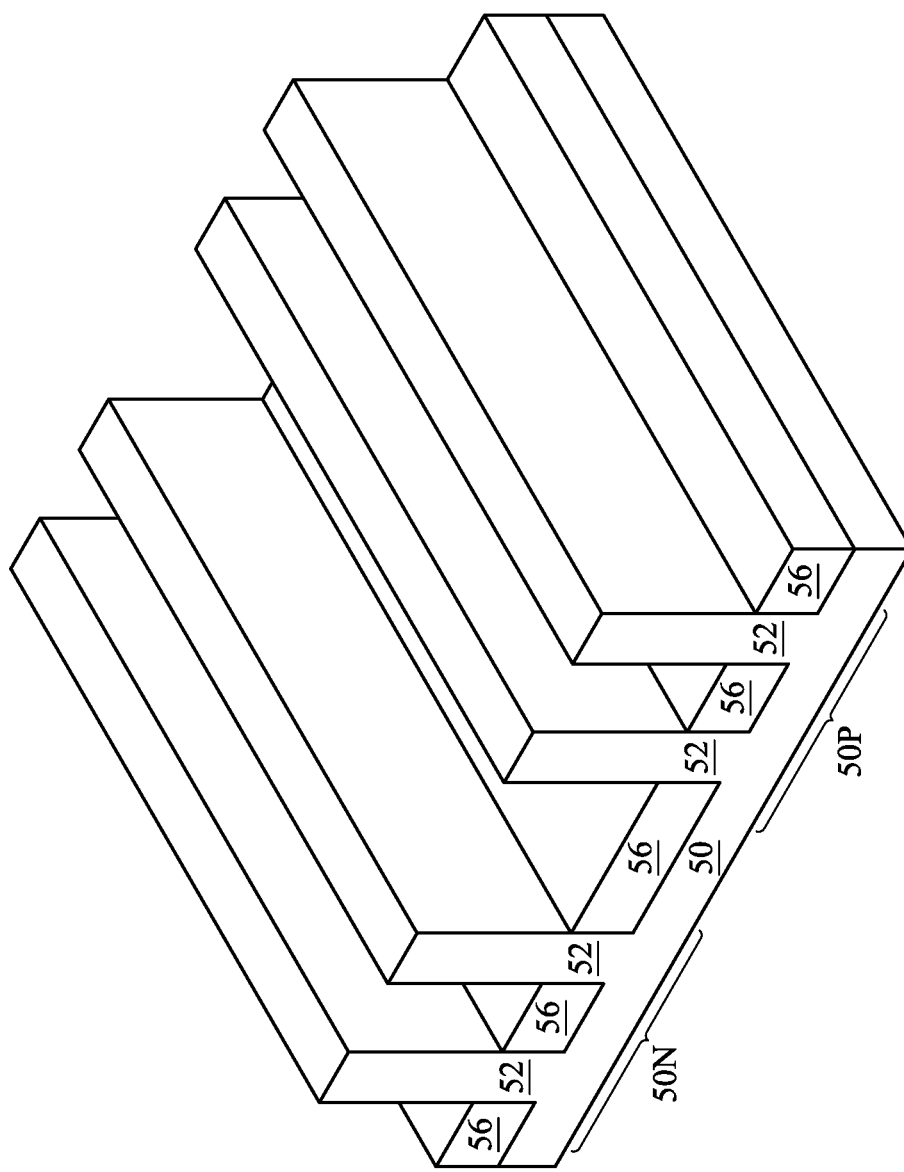
FIGS. 2 and 3 are three-dimensional views of intermediate stages in the manufacturing of FinFETs, in accordance with some embodiments.
Figure 3:
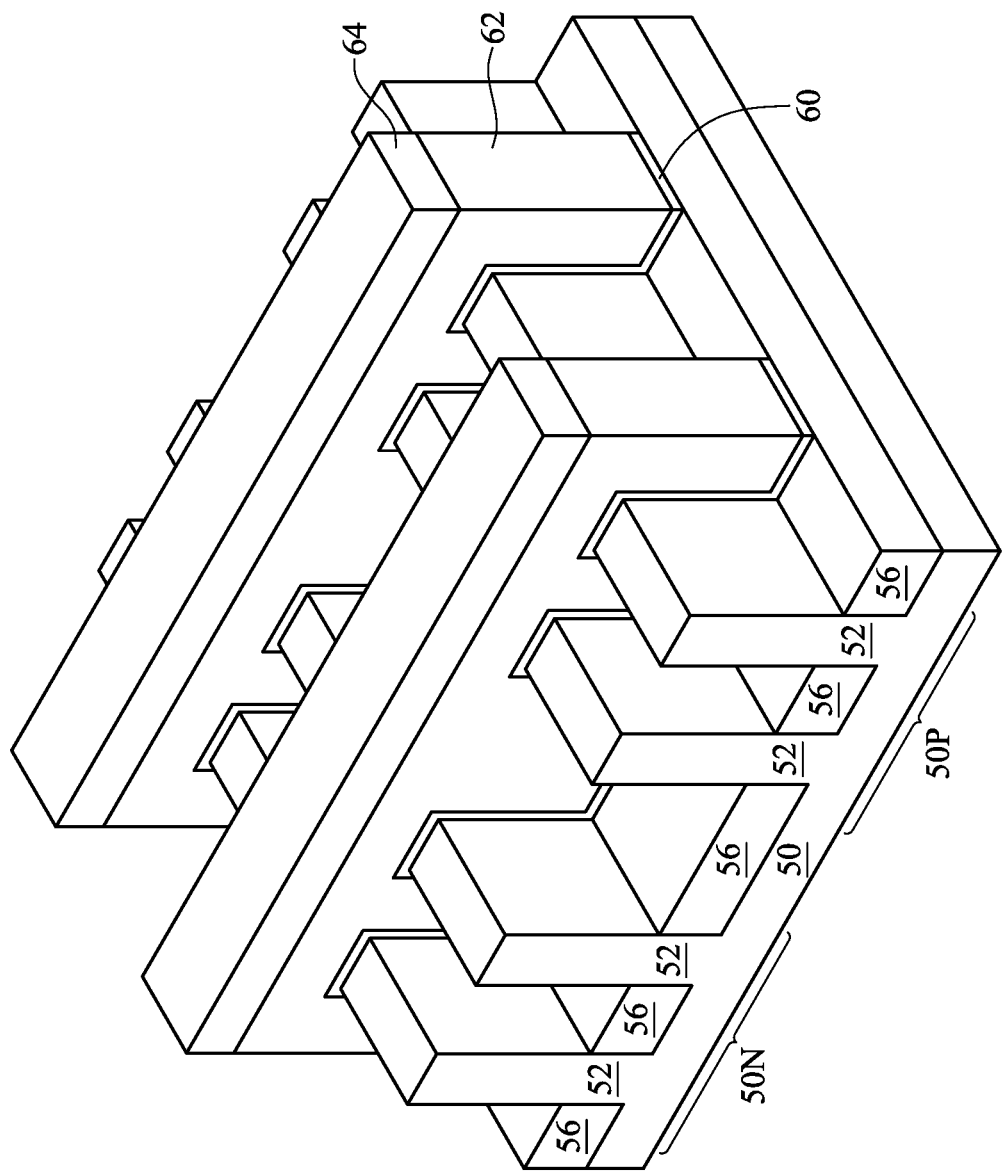

FIGS. 2 and 3 are three-dimensional views of intermediate stages in the manufacturing of FinFETs, in accordance with some embodiments. A substrate 50 is processed to form the FinFETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

In FIG. 2, fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process, such as a chemical mechanical polish (CMP), an etch back process, combinations thereof, or the like may be utilized. The planarization process exposes the fins 52 such that top surfaces of the fins 52 and the insulation material are planar after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. After the recessing, exposed portions of the fins 52 extend above top surfaces of the STI regions 56. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed of silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as from about $10^{17}$ $cm^{-3}$ to about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as from about $10^{17}$ $cm^{-3}$ to about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy gate dielectrics 60 are formed over the fins 52 and dummy gate electrodes 62 are formed over the dummy gate dielectrics 60. The dummy gate dielectrics 60 and dummy gate electrodes 62 may be collectively referred to as dummy gate stacks. The dummy gate stacks extend along sidewalls and top surfaces of the fins 52.

As an example of forming the dummy gate dielectrics 60 and dummy gate electrodes 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material such as amorphous silicon, polycrystalline-silicon (polysilicon), poly-crystalline silicon germanium (poly-SiGe), metallic nitrides, metallic silicides, metallic oxides, metals, or the like. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of STI regions 56. The mask layer may include, for example, silicon nitride, silicon oxynitride, or the like. In this example, a single dummy gate layer and a single mask layer are formed across the region 50N and the region 50P. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 64. The pattern of the masks 64 is then transferred to the dummy gate layer by an acceptable etching technique to form the dummy gate electrodes 62. The pattern of the masks 64 is further transferred to the dummy dielectric layer to form the dummy gate dielectrics 60. The dummy gate electrodes 62 cover respective channel regions 58 (see FIGS. 4A and 4B) of the fins 52. The dummy gate electrodes 62 may also have a lengthwise direction substantially perpendicular (within process limitations) to the lengthwise direction of respective fins 52.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 4A through 18D are cross-sectional views of further intermediate stages in the manufacturing of FinFETs, in accordance with some embodiments. FIGS. 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 16C, 16D, 16E, 16F, 17A, 17B, 18A, 18B, 18C, and 18D are cross-sectional views illustrated along reference cross-section A-A in FIG. 1, except only one source/drain region 70 is shown. FIGS. 4C and 4D are cross-sectional views illustrated along reference cross-section B-B in FIG. 1, except only two fins 52 are shown.

FIGS. 4A, 5A, 6A, 7A, 8A, 9A, 10A, 11A, 12A, 13A, 14A, 15A, 16A, 16C, 16E, 17A, 18A, and 18C illustrate a first region 50A of one or more fins 52. FIGS. 4B, 5B, 6B, 7B, 8B, 9B, 10B, 11B, 12B, 13B, 14B, 15B, 16B, 16D, 16F 17B, 18B, and 18D illustrate a second region 50B of one or more fins 52. The regions 50A and 50B are processed simultaneously and are discussed together. A single fin 52 is illustrated in each of the regions 50A and 50B, but it should be appreciated that each of the regions 50A and 50B can include fins 52 from both of the regions 50N and 50P of the substrate 50, e.g., the first region 50A and the second region 50B can each include n-type devices and p-type devices.

Figure 4B:
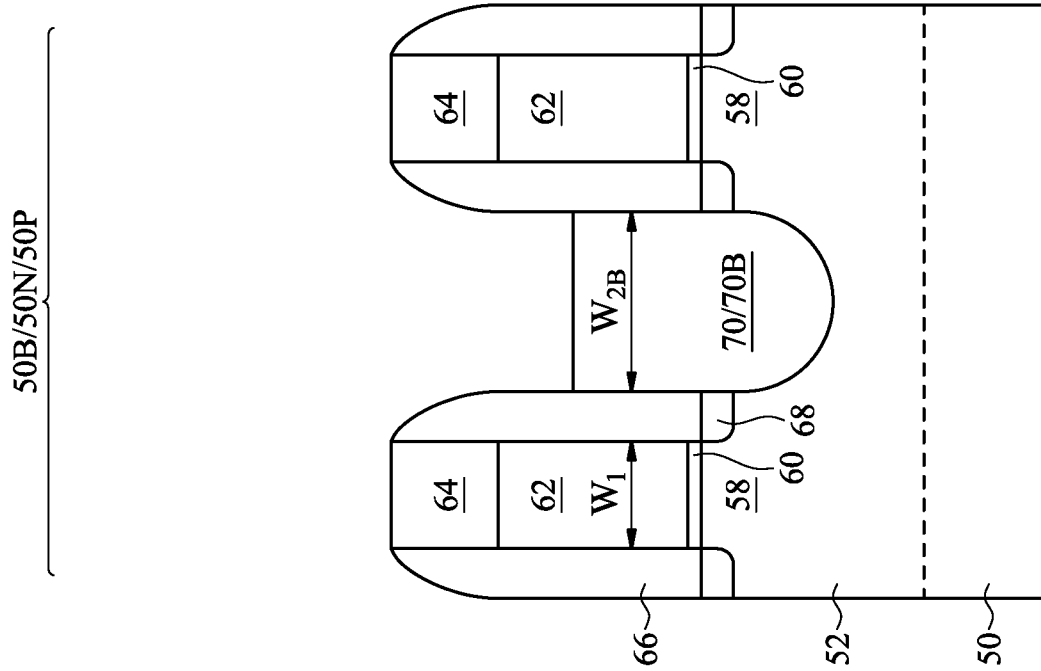
Figure 4A:
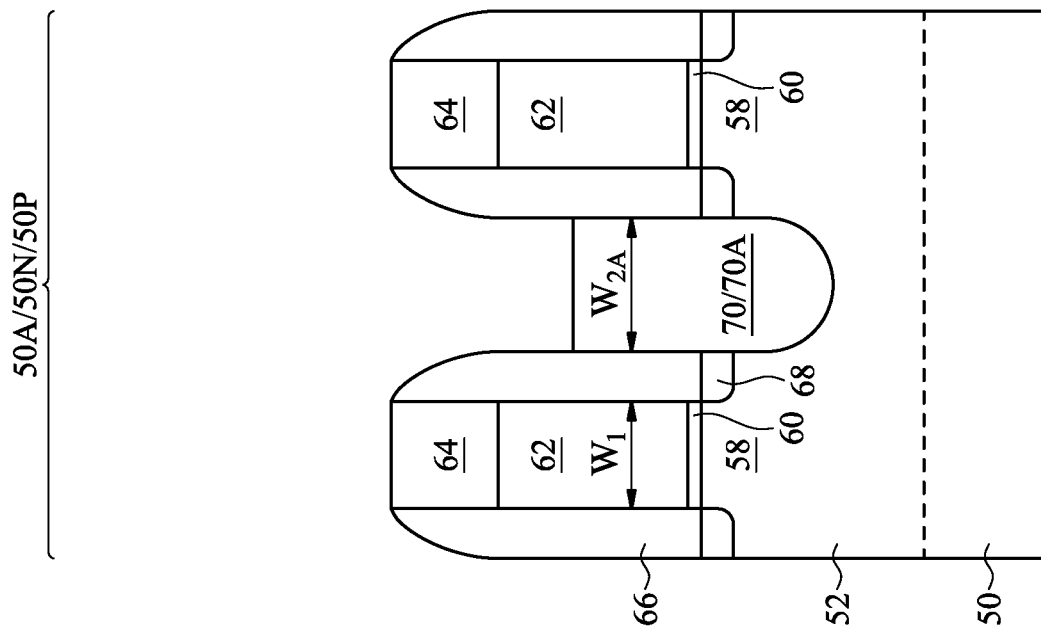
Figure 4D:
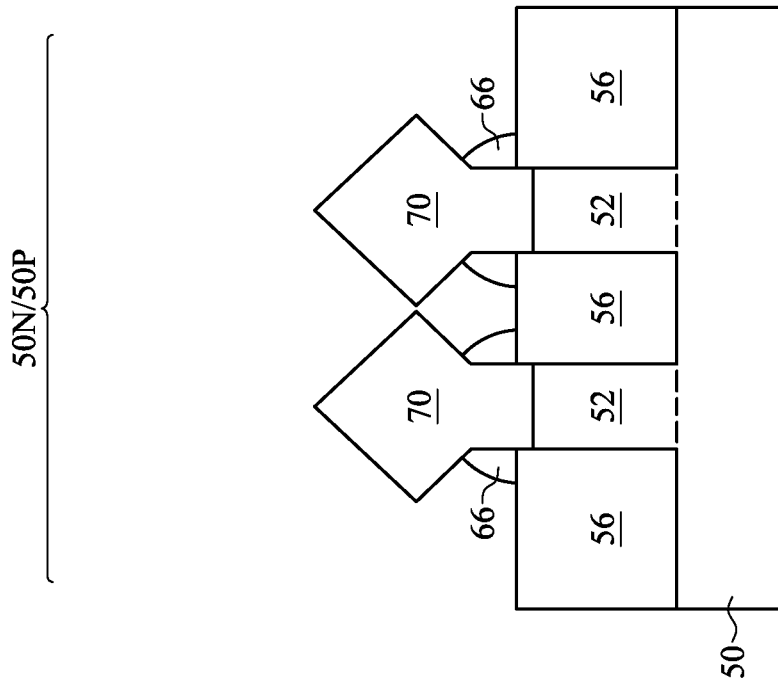
Figure 4C:
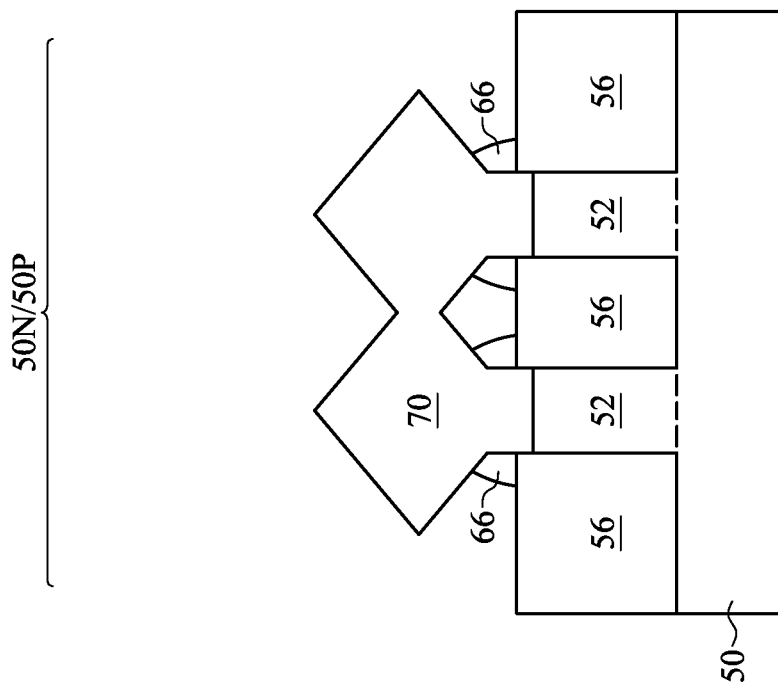

In FIGS. 4A and 4B, gate spacers 66 are formed on exposed surfaces of the dummy gate electrodes 62, the masks 64, and/or the fins 52. The gate spacers 66 may be formed by conformally depositing one or more layers of insulating material and subsequently etching the insulating material. The insulating material of the gate spacers 66 may be silicon oxide, silicon nitride, silicon carbonitride, silicon oxycarbonitride, a combination thereof, or the like, and may be formed by a conformal deposition process, such as chemical vapor deposition (CVD), plasma enhanced chemical vapor deposition (PECVD), atomic layer deposition (ALD), or the like. In some embodiments, the gate spacers 66 are formed of one or more silicon oxycarbonitride layer(s), such as two silicon oxycarbonitride layers. Once formed, the insulating material can be etched by, e.g., a wet etch to form the gate spacers 66. The etching of the gate spacers 66 can be anisotropic. After etching, the gate spacers 66 can have curved sidewalls (as illustrated) or can have straight sidewalls (not illustrated).

Before or during the formation of the gate spacers 66, implants for lightly doped source/drain (LDD) regions 68 may be performed. In the embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities in the range of about $10^{15}$ cm$^{-3}$ to about $10^{16}$ cm$^{-3}$. An anneal may be used to activate the implanted impurities.

Epitaxial source/drain regions 70 are then formed in the fins 52. The epitaxial source/drain regions 70 are formed in the fins 52 such that each dummy gate electrode 62 is disposed between respective neighboring pairs of the epitaxial source/drain regions 70. The epitaxial source/drain regions 70 extend into, and may also penetrate through, the LDD regions 68. In some embodiments, the gate spacers 66 are used to offset the epitaxial source/drain regions 70 from the dummy gate electrodes 62 by an appropriate lateral distance so that the epitaxial source/drain regions 70 do not short out subsequently formed gates of the resulting FinFETs. The epitaxial source/drain regions 70 may be formed to exert stress in the respective channel regions 58, thereby improving performance.

The epitaxial source/drain regions 70 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 70 in the region 50N are epitaxially grown in the recesses. The epitaxial source/drain regions 70 may include any acceptable material, such as appropriate for n-type FinFETs. For example, if the fins 52 in the region 50N are silicon, the epitaxial source/drain regions 70 in the region 50N may include materials exerting a tensile strain in the channel regions 58, such as silicon, silicon carbide, phosphorous doped silicon carbide, silicon phosphide, or the like. The epitaxial source/drain regions 70 in the region 50N may have surfaces raised from respective surfaces of the fins 52 and may have facets.

The epitaxial source/drain regions 70 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 70 in the region 50P are epitaxially grown in the recesses. The epitaxial source/drain regions 70 may include any acceptable material, such as appropriate for p-type FinFETs. For example, if the fins 52 in the region 50P are silicon, the epitaxial source/drain regions 70 in the region 50P may comprise materials exerting a compressive strain in the channel regions 58, such as silicon-germanium, boron doped silicon-germanium, germanium, germanium tin, or the like. The epitaxial source/drain regions 70 in the region 50P may also have surfaces raised from respective surfaces of the fins 52 and may have facets.

The epitaxial source/drain regions 70 and/or the fins 52 may be implanted with dopants to form source/drain regions, similar to the process previously discussed for forming lightly-doped source/drain regions, followed by an anneal. The source/drain regions may have an impurity concentration of from about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 70 may be in situ doped during growth.

As a result of the epitaxy processes used to form the epitaxial source/drain regions 70 in the region 50N and the region 50P, upper surfaces of the epitaxial source/drain regions have facets which expand laterally outward beyond sidewalls of the fins 52. In some embodiments, these facets cause adjacent epitaxial source/drain regions 70 of a same FinFET to merge, as illustrated by FIG. 4C. In other embodiments, adjacent epitaxial source/drain regions 70 remain separated after the epitaxy process is completed, as illustrated by FIG. 4D. In the embodiments illustrated in FIGS. 4C and 4D, the gate spacers 66 are formed covering a portion of the sidewalls of the fins 52 that extend above the STI regions 56, thereby blocking the epitaxial growth. In some other embodiments, the etch used to form the gate spacers 66 may be adjusted to remove the spacer material to allow the epitaxially grown region to extend to the surface of the STI regions 56.

The dummy gate electrodes 62 in the regions 50A and 50B have the same widths, thus producing channel regions 58 of the same lengths in the regions 50A and 50B. For example, the dummy gate electrodes 62 in the regions 50A and 50B can have widths Wi in the range of about 18 nm to about 22 nm when the regions 50A and 50B are core logic regions, and can have widths Wi in the range of about 25 nm to about 150 nm when the regions 50A and 50B are input/output regions. The epitaxial source/drain regions 70 in the regions 50A and 50B can have different widths due to epitaxy process variations. For example, epitaxial source/drain regions 70A in the first region 50A can have a width $W_{2A}$, and epitaxial source/drain regions 70B in the second region 50B can have a width $W_{2B}$, with the width $W_{2B}$ being greater than the width $W_{2A}$. The widths $W_{2A}$ and $W_{2B}$ can differ by as much as 100%. For example, when the regions 50A and 50B are core logic regions, the widths $W_{2A}$ and $W_{2B}$ can be in the range of about 15 nm to about 30 nm, with the widths $W_{2A}$ and $W_{2B}$ differing by as much as 15 nm. Likewise, when the regions 50A and 50B are input/output regions, the widths $W_{2A}$ and $W_{2B}$ can be in the range of about 40 nm to about 80 nm, with the widths $W_{2A}$ and $W_{2B}$ differing by as much as 40 nm.

Figure 5B:
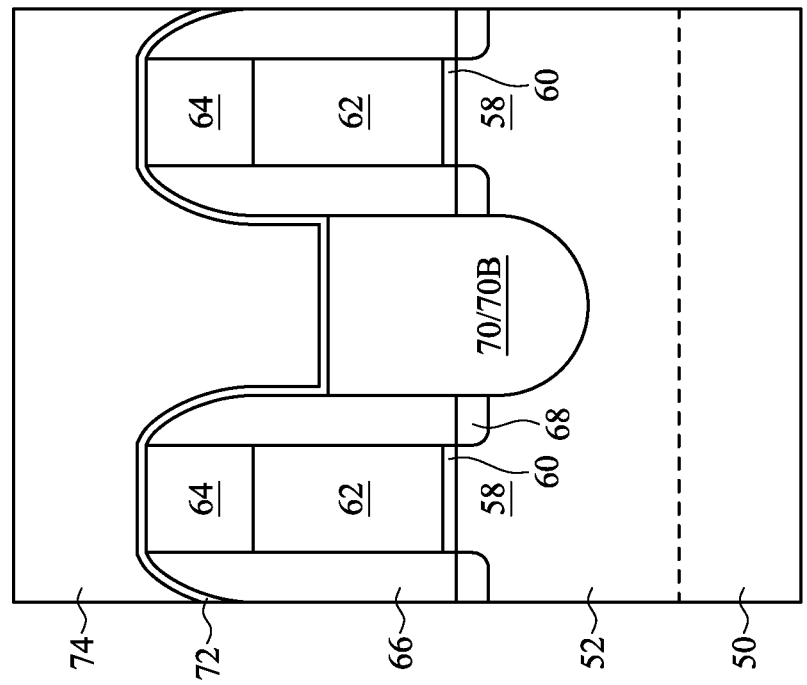
Figure 5A:
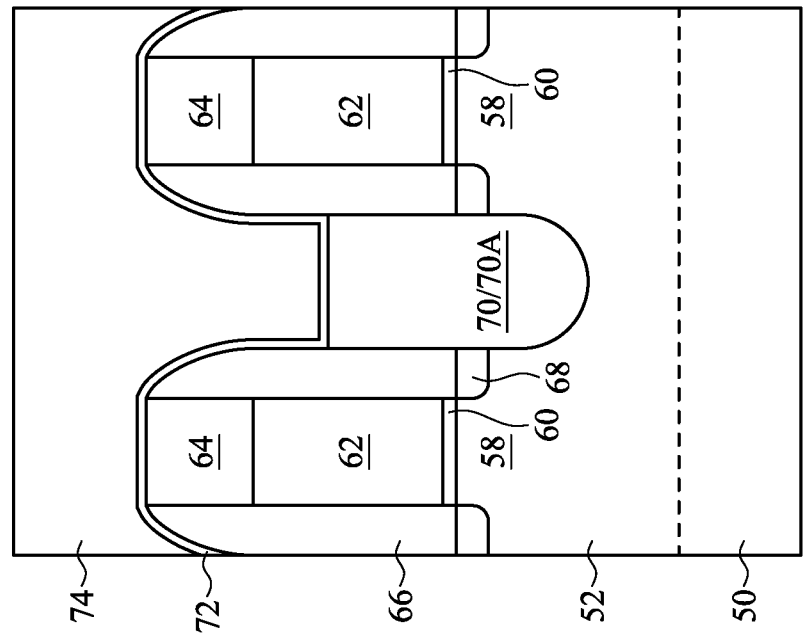

In FIGS. 5A and 5B, a first ILD layer 74 is deposited over the intermediate structure. The first ILD layer 74 may be formed of a dielectric material, and may be deposited by any suitable method, such as CVD, plasma-enhanced CVD (PECVD), or FCVD. Dielectric materials may include a silicate glass such as phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 72 is disposed between the first ILD layer 74 and the epitaxial source/drain regions 70, the gate spacers 66, and the masks 64. The CESL 72 may be formed of a dielectric material, such as silicon nitride, silicon oxide, silicon oxynitride, aluminum oxide, or the like, having a different etch rate than the material of the overlying first ILD layer 74, and may be formed by a suitable deposition process.

Figure 6B:
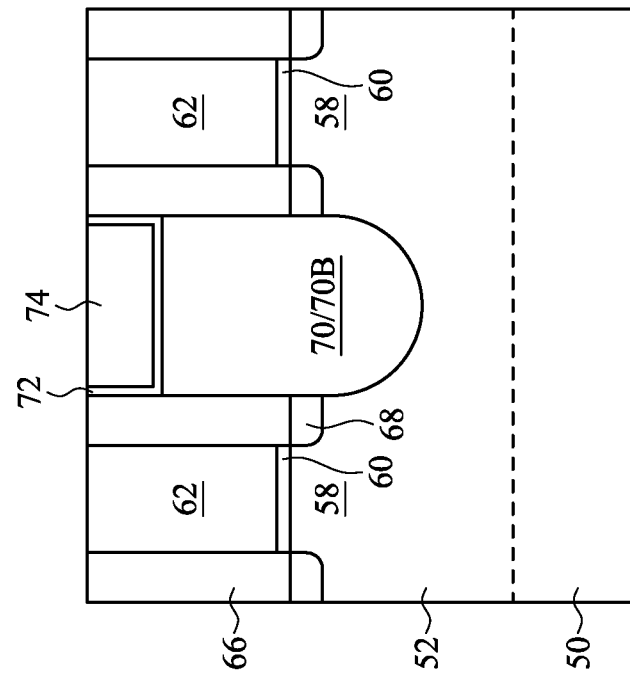
Figure 6A:
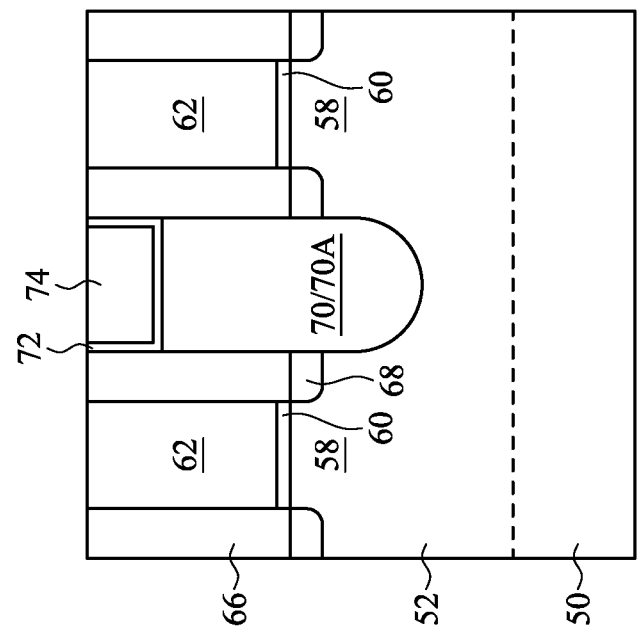

In FIGS. 6A and 6B, a planarization process, such as a CMP, may be performed to level the top surface of the first ILD layer 74 with the top surfaces of the dummy gate electrodes 62 or the masks 64. The planarization process may also remove the masks 64 on the dummy gate electrodes 62, and portions of the gate spacers 66 along sidewalls of the masks 64. After the planarization process, top surfaces of the dummy gate electrodes 62, the gate spacers 66, and the first ILD layer 74 are planar. Accordingly, the top surfaces of the dummy gate electrodes 62 are exposed through the first ILD layer 74. In some embodiments, the masks 64 may remain, in which case the planarization process levels the top surface of the first ILD layer 74 with the top surfaces of the top surface of the masks 64.

Figure 7B:
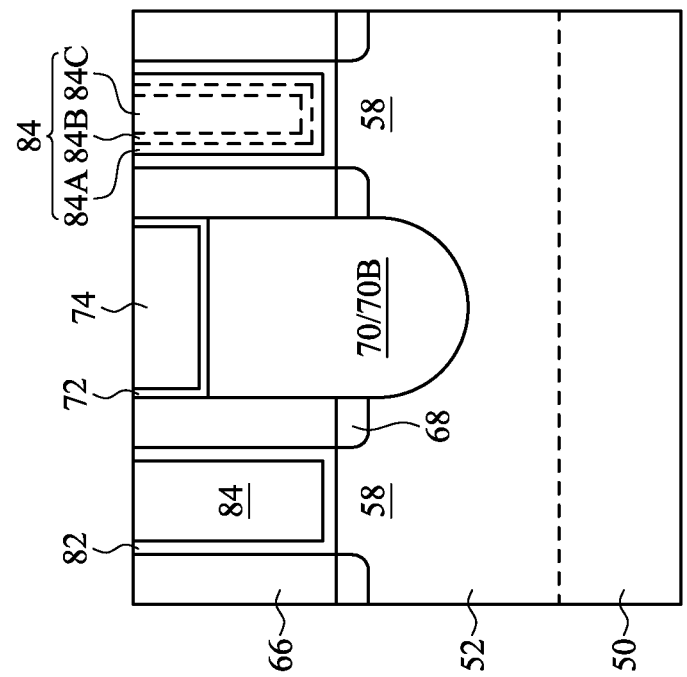
Figure 7A:
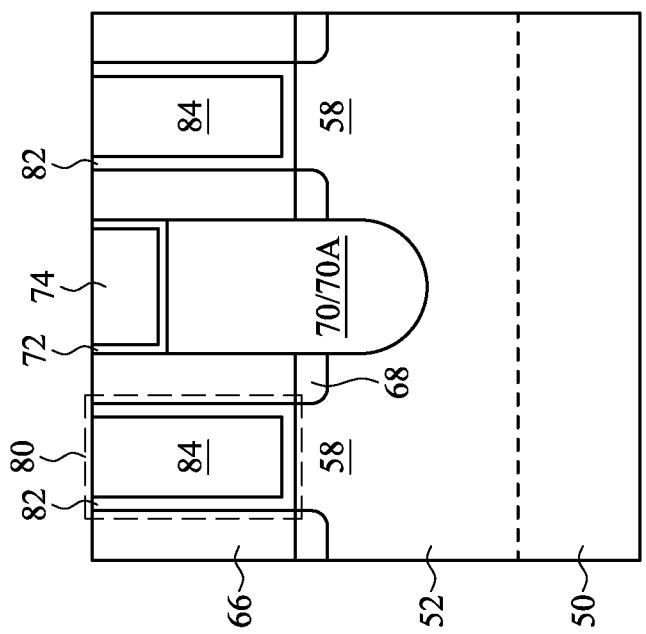

In FIGS. 7A and 7B, the dummy gate electrodes 62 and optionally the dummy gate dielectrics 60 are removed and are replaced with replacement gates 80. The replacement gates 80 include gate dielectrics 82 and gate electrodes 84. The replacement gates 80 may also be referred to as "gate stacks" or "metal gates." The replacement gates 80 extend along sidewalls of the channel regions 58 of the fins 52.

As an example to form the replacement gates 80, the dummy gate electrodes 62, and the masks 64 if present, are removed in one or more etching step(s), so that recesses are formed. Portions of the dummy gate dielectrics 60 in the recesses may also be removed. In some embodiments (not shown), only the dummy gate electrodes 62 are removed and the dummy gate dielectrics 60 remain and are exposed by the recesses. For example, the dummy gate dielectrics 60 can be removed from recesses in a first region of a die (e.g., a core logic region) and remain in recesses in a second region of the die (e.g., an input/output region). In some embodiments, the dummy gate electrodes 62 are removed by an anisotropic dry etch process. For example, the etching process may include a dry etch process using reaction gas(es) that selectively remove the material of the dummy gate electrodes 62 at a greater rate than the materials of the first ILD layer 74 and gate spacers 66. The recesses expose the fins 52. Specifically, the channel regions 58 are exposed by the recesses. Each channel region 58 is disposed between neighboring pairs of the epitaxial source/drain regions 70. During the removal, the dummy gate dielectrics 60 may be used as etch stop layers when the dummy gate electrodes 62 are etched. The dummy gate dielectrics 60 may then be optionally removed after the removal of the dummy gate electrodes 62. After the removal, the gate dielectrics 82 are deposited conformally in the recesses, such as on the top surfaces and the sidewalls of the fins 52 and on sidewalls of the gate spacers 66. The gate dielectrics 82 may also be formed on top surface of the first ILD layer 74. In some embodiments, the gate dielectrics 82 comprise silicon oxide, silicon nitride, or multilayers thereof. In some embodiments, the gate dielectrics 82 include a high-k dielectric material, and in these embodiments, the gate dielectrics 82 may have a k value greater than about 7.0, and may include a metal oxide or a silicate of Hf, Al, Zr, La, Mg, Ba, Ti, Pb, and combinations thereof. The formation methods of the gate dielectrics 82 may include Molecular-Beam Deposition (MBD), atomic layer deposition (ALD), PECVD, and the like. In embodiments where portions of the dummy gate dielectrics 60 remain in the recesses, the gate dielectrics 82 include a material of the dummy gate dielectrics 60 (e.g., silicon oxide). The gate electrodes 84 are deposited over the gate dielectrics 82, respectively, and fill the remaining portions of the recesses. The gate electrodes 84 may include a metal-containing material, such as TiN, TiO, TaN, TaC, Co, Ru, Al, W, combinations thereof, or multi-layers thereof. For example, although a single-layered gate electrode 84 is illustrated in some figures, each gate electrode 84 may comprise any number of liner layers 84A, any number of work function tuning layers 84B, and a fill material 84C, as shown in FIG. 7B. After the filling of the gate electrodes 84, a planarization process, such as a CMP, may be performed to remove the excess portions of the gate dielectrics 82 and the material of the gate electrodes 84, which excess portions are over the top surface of the first ILD layer 74. The remaining portions of material of the gate dielectrics 82 and gate electrodes 84 thus form the replacement gates 80 of the resulting FinFETs.

Figure 8A:
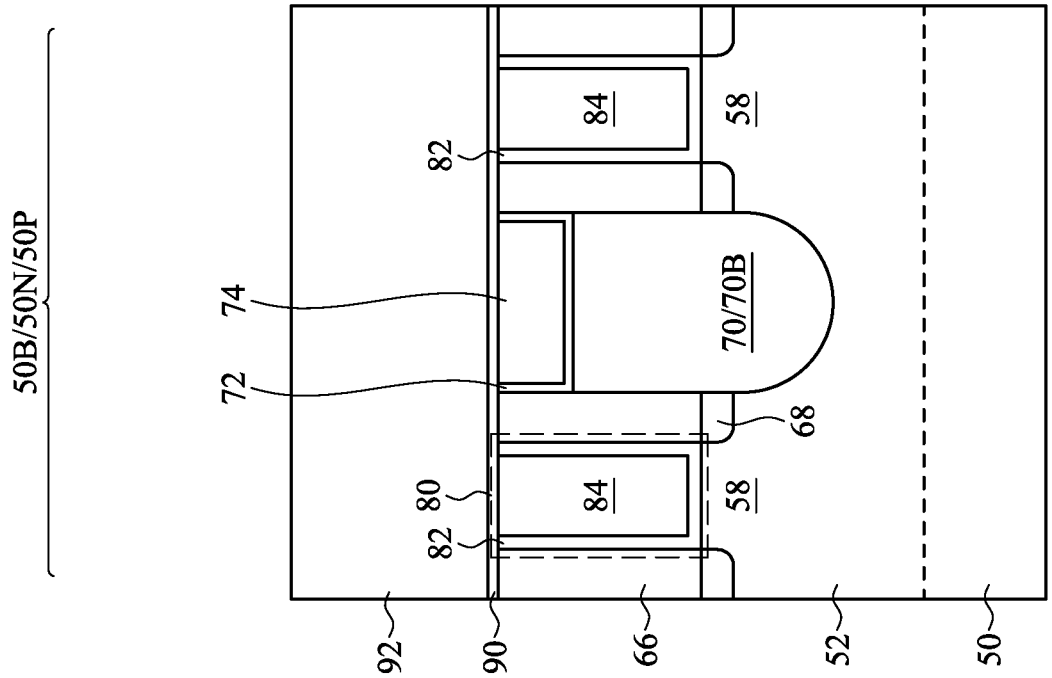
Figure 8B:
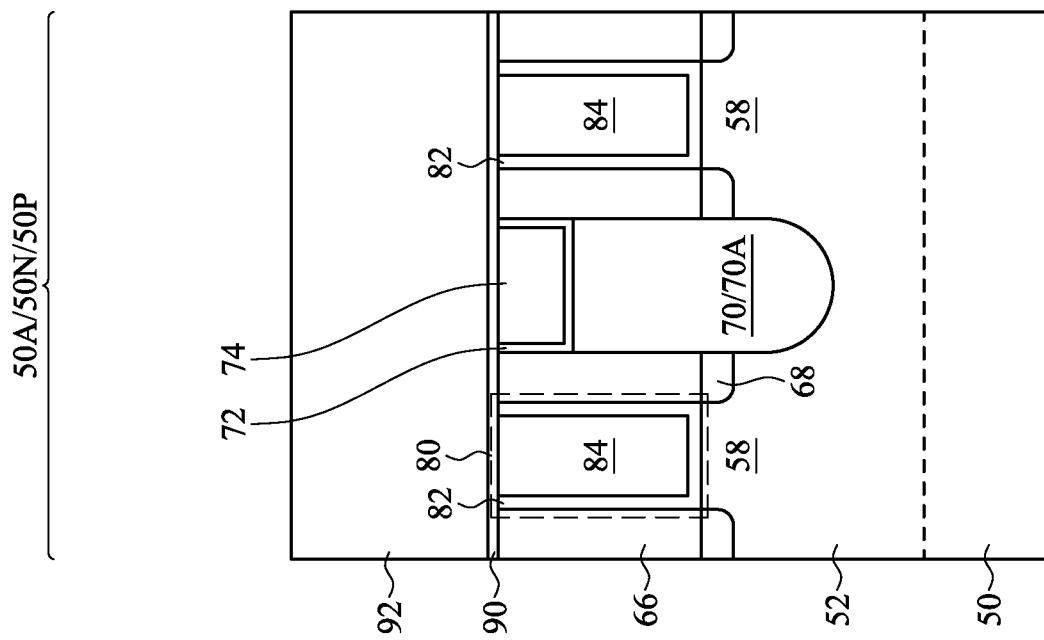

In FIGS. 8A and 8B, a second ILD layer 92 is deposited over the first ILD layer 74. In some embodiment, the second ILD layer 92 is a flowable film formed by a flowable CVD method. In some embodiments, the second ILD layer 92 is formed of a dielectric material, such as PSG, BSG, BPSG, USG, or the like, and may be deposited by any suitable method, such as CVD and PECVD. In some embodiments, an etch stop layer 90 is disposed between the second ILD layer 92 and the gate electrodes 84, the first ILD layer 74, and the gate spacers 66. The etch stop layer 90 may be formed of a dielectric material, such as, silicon nitride, silicon oxide, silicon oxynitride, aluminum oxide, or the like, having a different etch rate than the material of the overlying second ILD layer 92, and may be formed by a suitable deposition process. In some embodiments, before the formation of the second ILD layer 92 and etch stop layer 90, the replacement gates 80 (e.g., gate dielectrics 82 and gate electrodes 84) can be recessed and gate masks can be formed in the recesses.

It should be appreciated that the structure illustrated is only one example structure. Other variations are possible. For example, the illustrated structure includes two ILD layers 74 and 92 and two etch stop layers 72 and 90, but any number of ILD layers and etch stop layers may be used. In some embodiments, such as in a gate-first process, a single ILD layer and a single etch stop layer may be used.

Figure 9B:
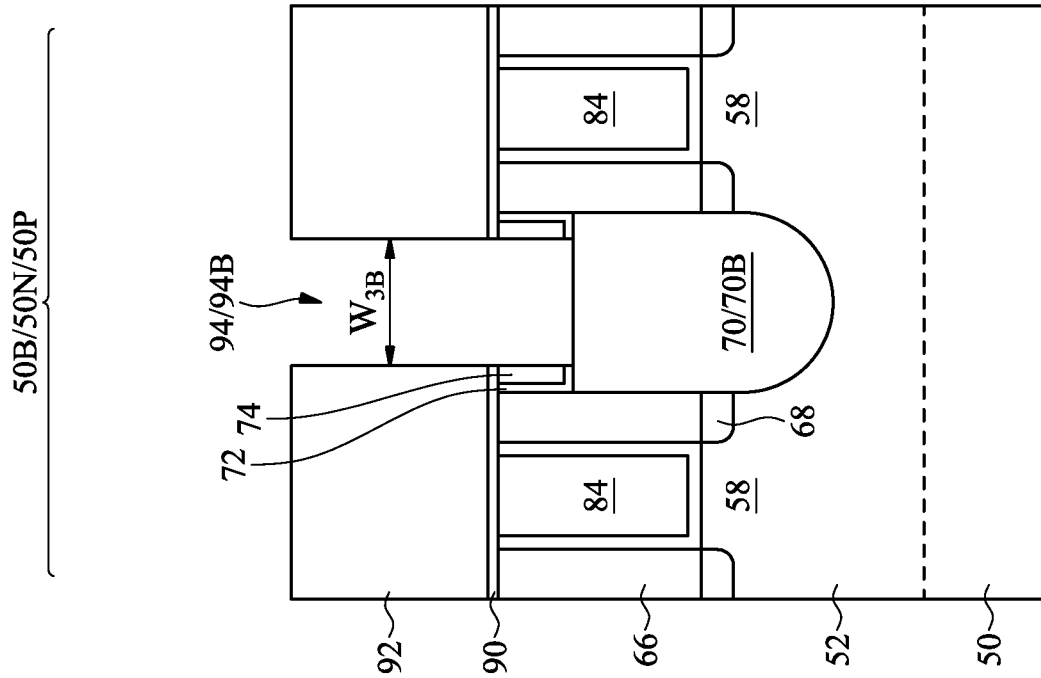
Figure 9A:
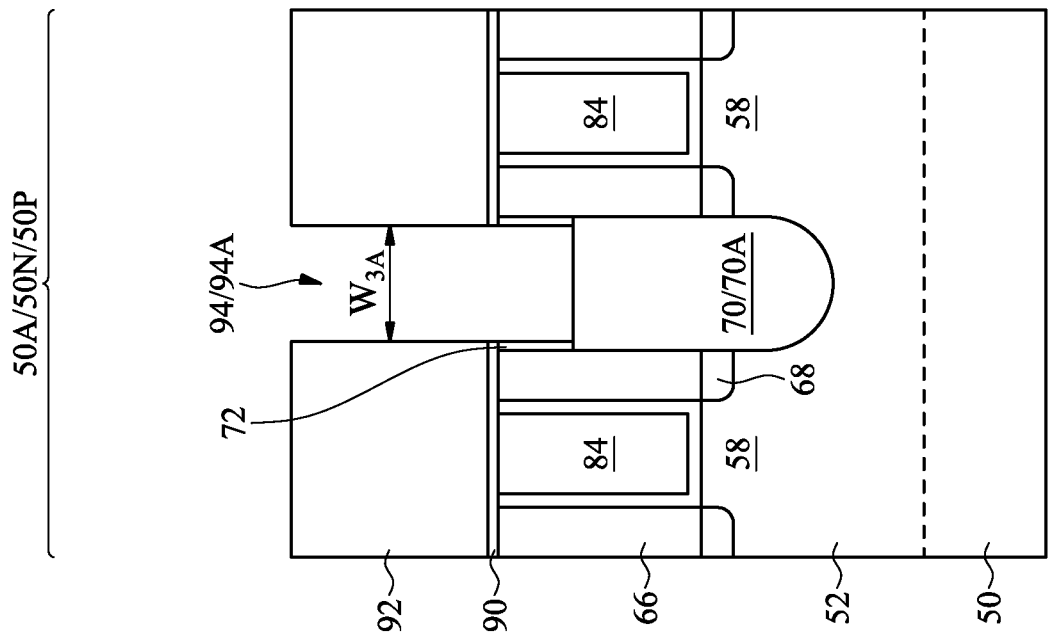

In FIGS. 9A and 9B, contact openings 94 are formed through the ILD layers 74 and 92 and the etch stop layers 72 and 90. The contact openings 94 expose the epitaxial source/drain regions 70. The contact openings 94 may be formed using acceptable photolithography and etching techniques. In some embodiments, some loss of the epitaxial source/drain regions 70 may be realized as a result of etching the contact openings 94, such as by over-etching. The etching of the contact openings 94 can remove all of the first ILD layer 74 (see FIG. 9A) or only some of the first ILD layer 74 (see FIG. 9B) over the epitaxial source/drain regions 70.

Variation in the widths of the contact openings 94 can occur due to tooling errors, masking errors, and/or topography variations of the layers overlying the epitaxial source/drain regions 70 (e.g., the ILD layers 74 and 92). As such, the contact openings 94 can have non-uniform widths. For example, the differences in the widths $W_{2A}$ and $W_{2B}$ (see FIGS. 4A and 4B) of the epitaxial source/drain regions 70A and 70B can cause pattern loading, and so the first ILD layer 74 and/or second ILD layer 92 can have uneven topography, which can cause the contact openings 94 to have different widths in the regions 50A and 50B. Specifically, forming larger epitaxial source/drain regions 70B in the second region 50B can result in the contact openings 94 being wider and having a lower aspect ratio in the second region 50B. For example, contact openings 94A in the first region 50A can have a width $W_{3A}$ in the range of about 20 nm to about 24 nm, and contact openings 94B in the second region 50B can have a width $W_{3B}$ in the range of about 30 nm to about 40 nm, with the width $W_{3B}$ being from about 25% to about 100% greater than the width $W_{3A}$. As discussed further below, the variation in the widths of the contact openings 94 will be reduced by subsequently formed spacers.

Figure 10A:
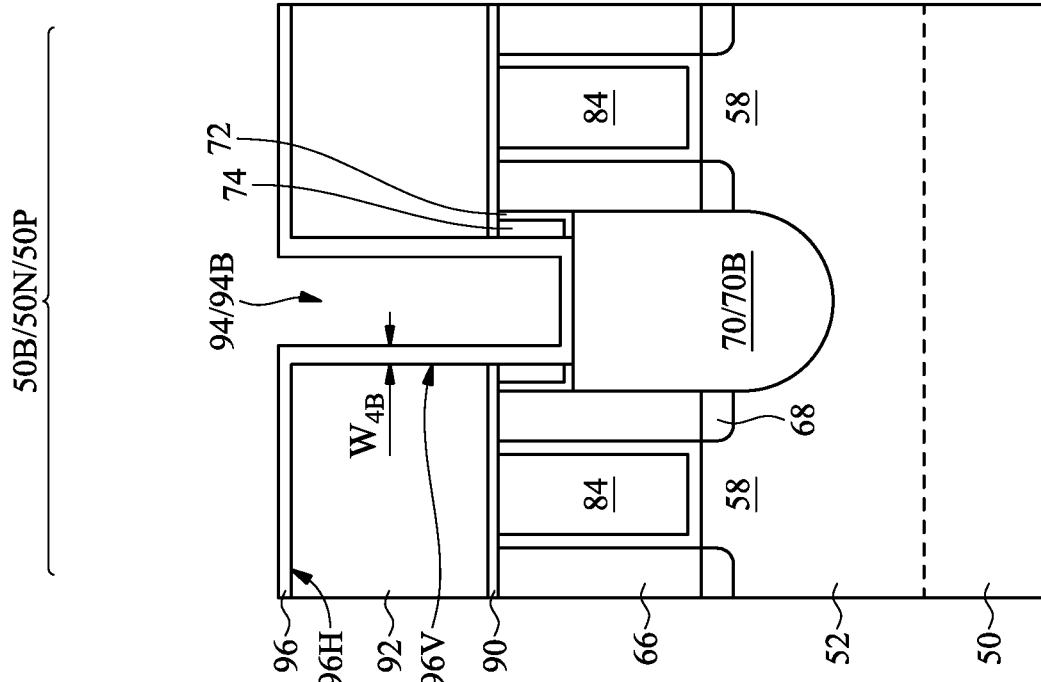
Figure 10B:
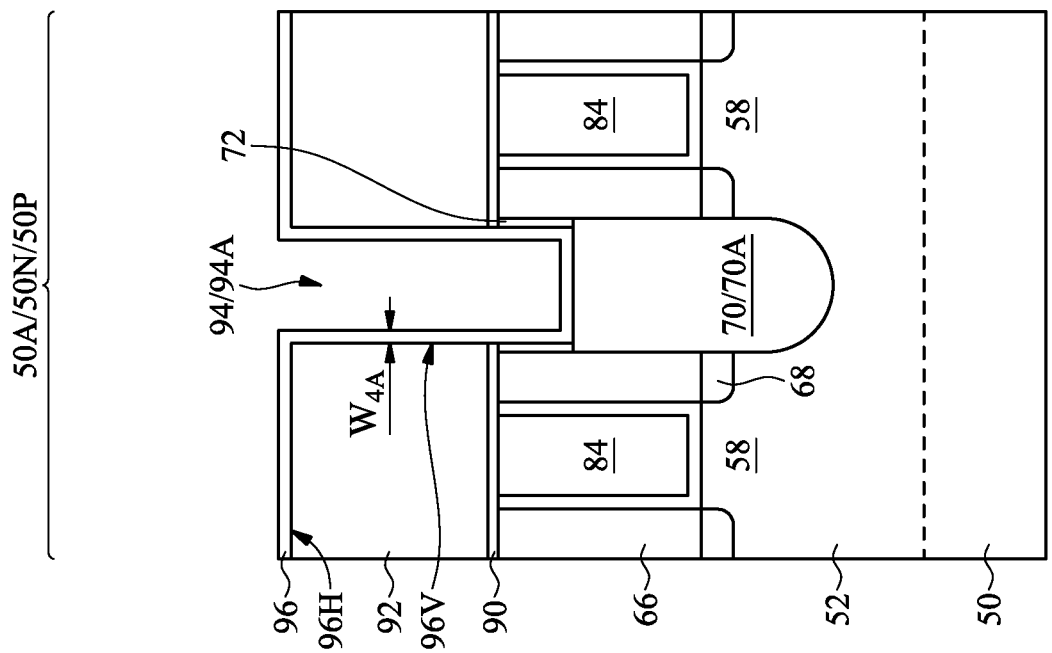

In FIGS. 10A and 10B, a sacrificial spacer layer 96 is deposited in the contact openings 94. Deposition is conformal such that the sacrificial spacer layer 96 has horizontal portions 96H and vertical portions 96V. The sacrificial spacer layer 96 is formed of a material that has a high etching selectivity with subsequently formed contact spacers (discussed below). The sacrificial spacer layer 96 may be formed of a non-conductive material, such as undoped silicon, silicon oxide, silicon nitride, silicon oxycarbonitride, or the like, and may be formed by a deposition process, such as CVD, ALD, or the like.

In some embodiments, the sacrificial spacer layer 96 is a layer of undoped silicon formed by a deposition process with a low uniformity, such as CVD. Forming the sacrificial spacer layer 96 by a low uniformity deposition process results in the sacrificial spacer layer 96 having vertical portions 96V with non-uniform widths. Specifically, contact openings 94 with a greater aspect ratio accommodate a lesser volume of the precursor gases for the CVD. As such, less sacrificial spacer layer 96 material is formed in the smaller contact openings 94A than in the larger contact openings 94B, and the vertical portions 96V of the sacrificial spacer layer 96 in the contact openings 94B are wider than the vertical portions 96V of the sacrificial spacer layer 96 in the contact openings 94A. For example, the vertical portions 96V in the contact openings 94A can have a width $W_{4A}$, and the vertical portions 96V in the contact openings 94B can have a width $W_{4B}$, with the width $W_{4B}$ being greater than the width $W_{4A}$. Details about the widths $W_{4A}$ and $W_{4B}$ are discussed further below.

Figure 11B:
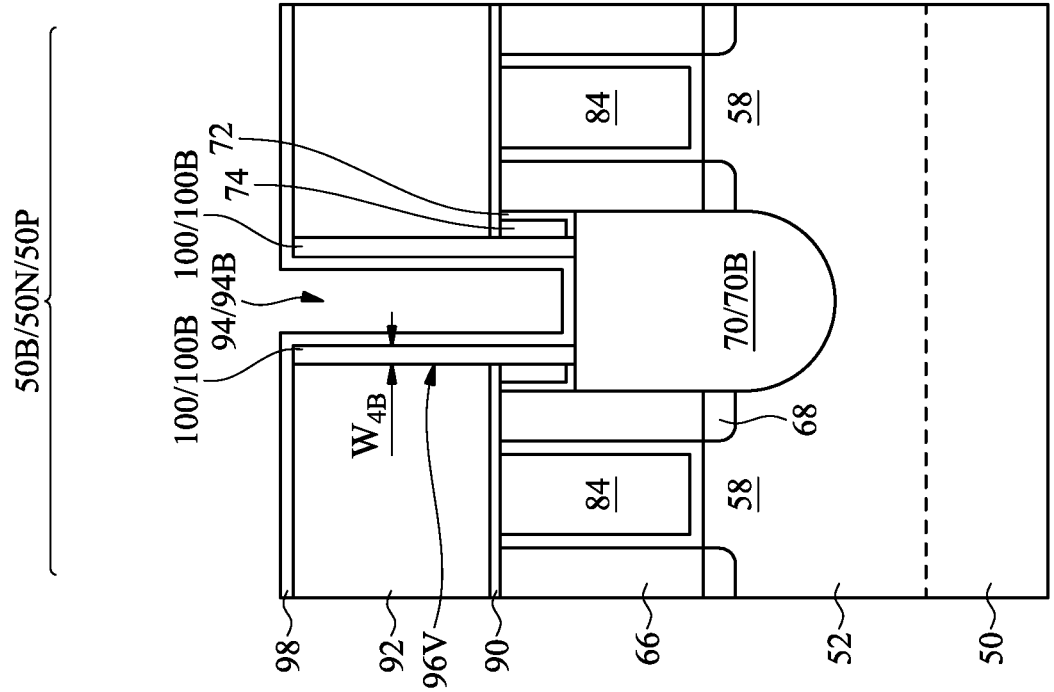
Figure 11A:
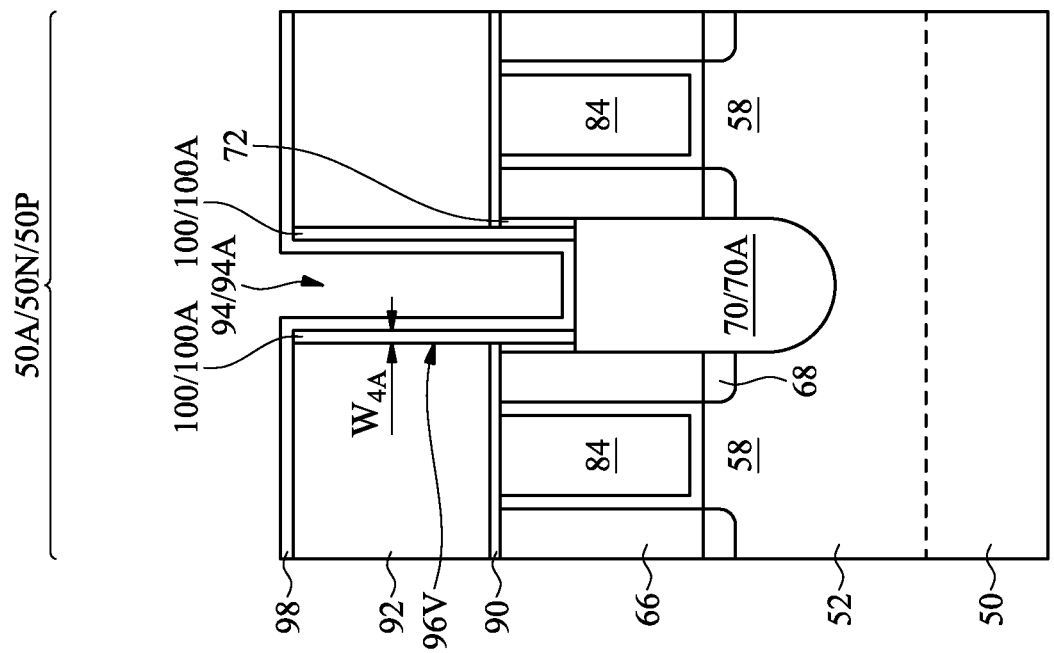

In FIGS. 11A and 11B, the horizontal portions 96H of the sacrificial spacer layer 96 are removed. The horizontal portions 96H can be removed by acceptable etching techniques. In some embodiments, the horizontal portions 96H are removed by a dry etch process. For example, the etching process may include an isotropic dry etch using reaction gas(es) that selectively remove the material of the sacrificial spacer layer 96 at a greater rate than the materials of the second ILD layer 92 and epitaxial source/drain regions 70. In embodiments where the sacrificial spacer layer 96 is undoped silicon, the reaction gas(es) can include bromine chloride (BrCl), methane (CH$_4$), fluoromethane (CH$_3$F), combinations thereof, or the like. Some spacer byproduct 98 can be formed by the etching process. The spacer byproduct 98 can be along sidewalls and bottoms of the contact openings 94, and can also be along a surface of the second ILD layer 92. Continuing the above example where the sacrificial spacer layer 96 is undoped silicon, the spacer byproduct 98 can be formed of a polymer such as a bromosiloxane or a chlorosiloxane. The spacer byproduct 98 can be an oxide.

The remaining vertical portions 96V of the sacrificial spacer layer 96 are sacrificial spacers 100 that will be removed in a subsequent etching process to form voids surrounding the subsequently formed source/drain contacts. In some embodiments, such as when the etching process is isotropic, the sacrificial spacers 100 can have substantially the same widths as the corresponding vertical portions 96V of the sacrificial spacer layer 96. In other words, sacrificial spacers 100A in the contact openings 94A can have the same width $W_{4A}$ as the vertical portions 96V in the contact openings 94A, and sacrificial spacers 100B in the contact openings 94B can have the same width $W_{4B}$ as the vertical portions 96V in the contact openings 94B. After the etching, the sacrificial spacers 100A can have a width $W_{4A}$ in the range of about 3 nm to about 5 nm, and the sacrificial spacers 100B can have a width $W_{4B}$ in the range of about 6 nm to about 11 nm, with the width $W_{4B}$ being from about 20% to about 270% greater than the width $W_{4A}$.

Figure 12B:
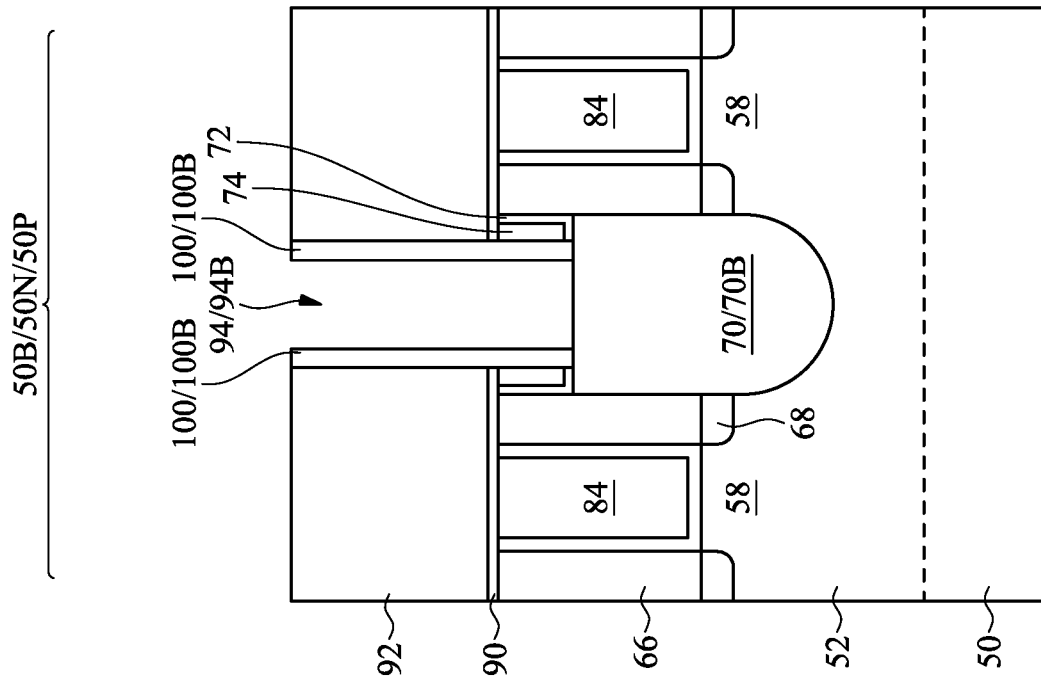
Figure 12A:
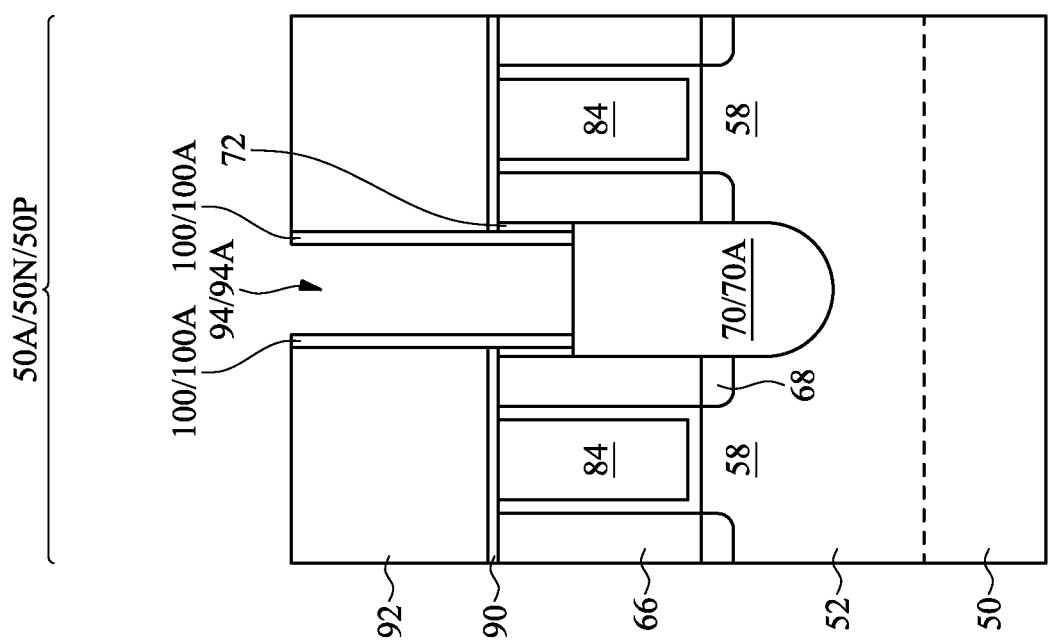

In FIGS. 12A and 12B, the spacer byproduct 98 can optionally be removed to expose the epitaxial source/drain regions 70. When the spacer byproduct 98 is an oxide, it can be removed by a chemical oxide removal, such as a wet etch using dilute hydrofluoric (dHF) acid, deionized water (DIW), or the like. After the spacer byproduct 98 is removed, the sacrificial spacers 100 remain in the contact openings 94.

Figure 13B:
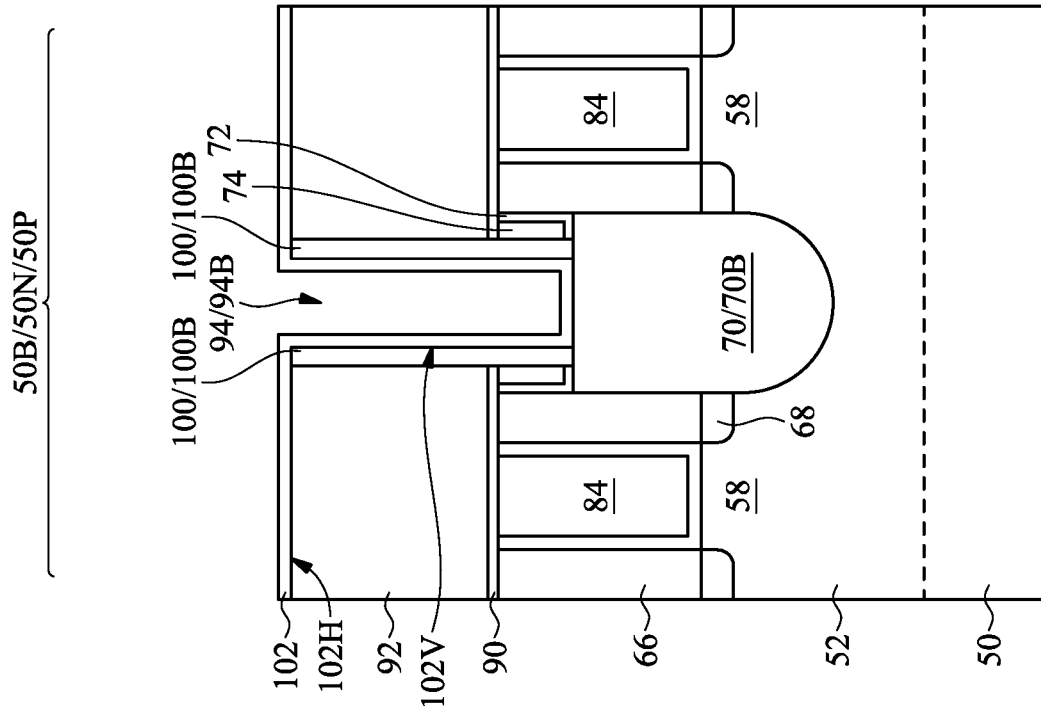
Figure 13A:
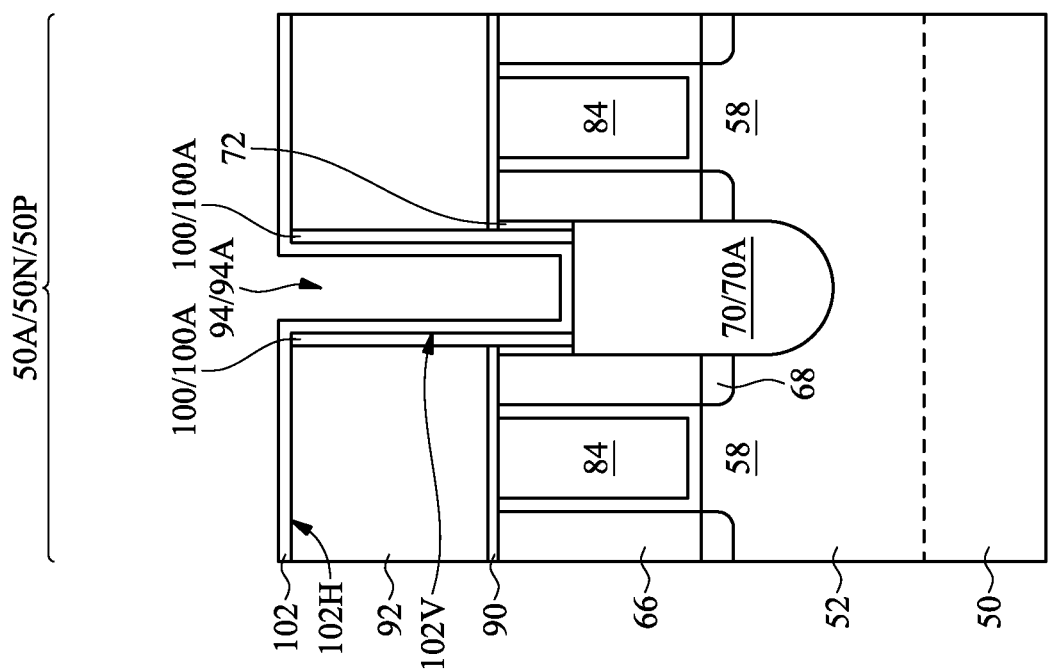

In FIGS. 13A and 13B, a contact spacer layer 102 is deposited over the intermediate structure and in the contact openings 94. The contact spacer layer 102 is over the epitaxial source/drain regions 70 and extends along sidewalls of the sacrificial spacers 100. Deposition is conformal such that the contact spacer layer 102 has horizontal portions 102H and vertical portions 102V. The contact spacer layer 102 may be formed of a dielectric material, such as silicon nitride, silicon oxide, silicon oxynitride, aluminum oxide, or the like. In some embodiments, the etch stop layers 72 and 90 and the contact spacer layer 102 are formed of the same dielectric material, such as silicon nitride. The contact spacer layer 102 may be formed by a deposition process, such as CVD, ALD, or the like.

In some embodiments, the contact spacer layer 102 is a layer of silicon nitride formed by a deposition process with a high uniformity, such as a self-limiting process, such as ALD. The deposition process for the contact spacer layer 102 has a greater uniformity than the deposition process for the sacrificial spacer layer 96. Forming the contact spacer layer 102 by a high uniformity deposition process results in the contact spacer layer 102 having vertical portions 102V with substantially uniform widths (within process limitations) in the regions 50A and 50B. Specifically, a self-limiting deposition process, given sufficient time, can form the contact spacer layer 102 to uniform thickness regardless of the various dimensions of the contact openings 94.

Figure 14B:
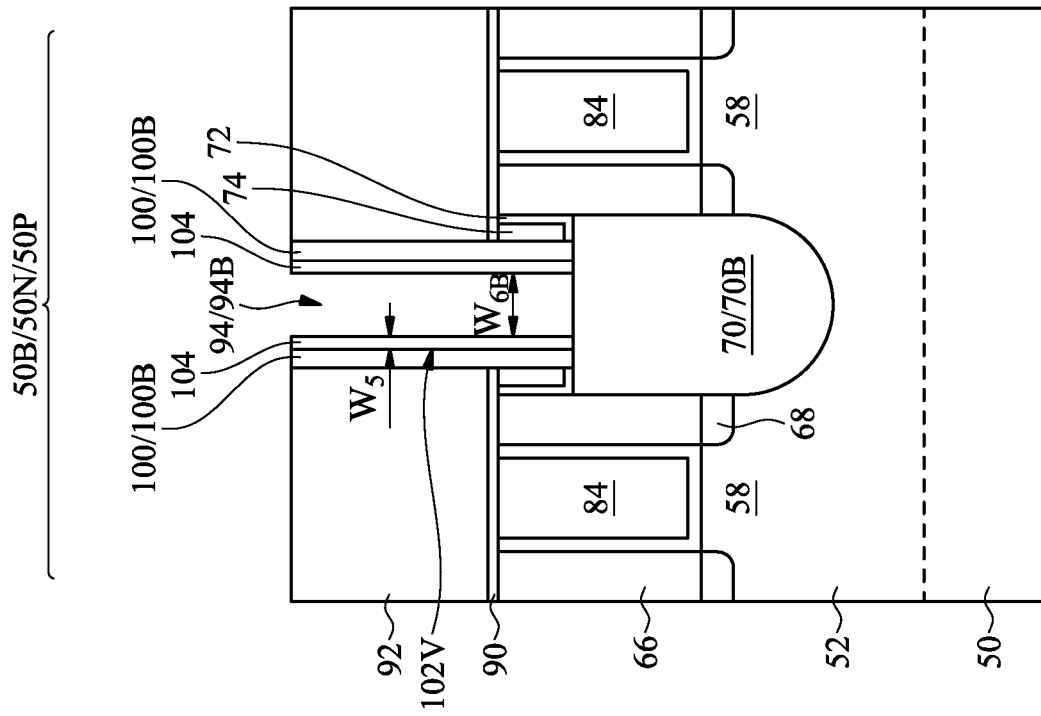
Figure 14A:
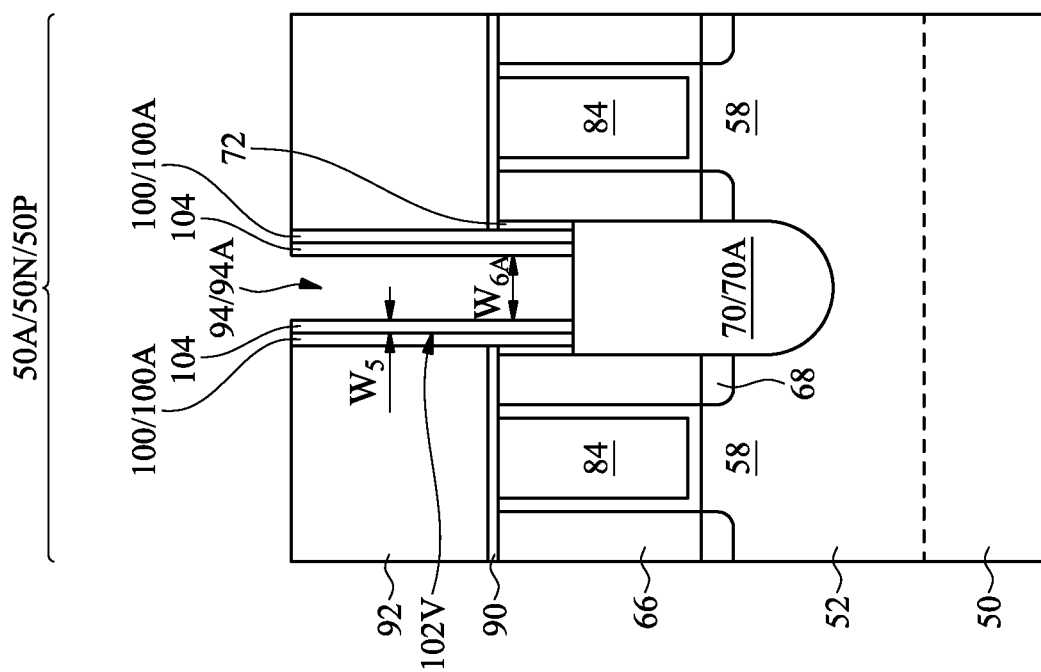

In FIGS. 14A and 14B, an etching process is performed to remove the horizontal portions 102H of the contact spacer layer 102, leaving the vertical portions 102V of the contact spacer layer 102 in the contact openings 94. The etching may be by a wet or dry etch. The remaining vertical portions 102V of the contact spacer layer 102 are contact spacers 104 that act as an additional barrier layer for the subsequently formed source/drain contacts. The contact spacers 104 have uniform widths (within process limitations) in the regions 50A and 50B. For example, the contact spacers 104 in the contact openings 94A and 94B can have a same width $W_5$ in the range of about 2.5 nm to about 3.0 nm.

The contact openings 94 have reduced widths after the sacrificial spacers 100 and contact spacers 104 are formed. For example, after the sacrificial spacers 100 and contact spacers 104 are formed, the contact openings 94A can have a width $W_{6A}$ in the range of about 12.5 nm to about 13.5 nm, and the contact openings 94B can have a width $W_{6B}$ in the range of about 16 nm to about 18 nm, with the final widths $W_{6A}$ and $W_{6B}$ of the contact openings 94 being less than the initial widths $W_{3A}$ and $W_{3B}$ (see FIGS. 9A and 9B) of the contact openings 94. Specifically, the widths $W_{6A}$ and $W_{6B}$ are less than the widths $W_{3A}$ and $W_{3B}$ by, respectively, the widths $W_{4A}$ and $W_{4B}$. As noted above, the widths $W_{4A}$ of the sacrificial spacers 100A are less than the widths $W_{4B}$ of the sacrificial spacers 100B. Thus, the widths of the contact openings 94B are reduced by a greater amount than the widths of the contact openings 94A. For example, the width $W_{6A}$ can be from about 40% to about 60% less than the width $W_{3A}$ and the width $W_{6B}$ can be from about 52% to about 68% less than the width $W_{3B}$, with the difference between the widths $W_{3B}$ and $W_{6B}$ being greater than the difference between the widths $W_{3A}$ and $W_{6A}$. As such, the final widths $W_{6A}$ and $W_{6B}$ of the contact openings 94 differ by less than the initial widths $W_{3A}$ and $W_{3B}$ of the contact openings 94. In particular, the variation between the final widths $W_{6A}$ and $W_{6B}$ of the contact openings 94 can be small, and in fact can be small enough to satisfy the three-sigma rule. For example, the width $W_{6B}$ can be greater than the width $W_{6A}$ by a small amount, such as from about 18% to about 44%. Forming the vertical portions 96V of the sacrificial spacer layer 96 to non-uniform widths allows such a reduction in the variation of the widths $W_{6A}$ and $W_{6B}$ of the contact openings 94. Reducing the variation of the widths $W_{6A}$ and $W_{6B}$ helps the subsequently formed source/drain contacts be adjusted to desired values, which may help reduce the shorting of contacts.

Figure 15A:
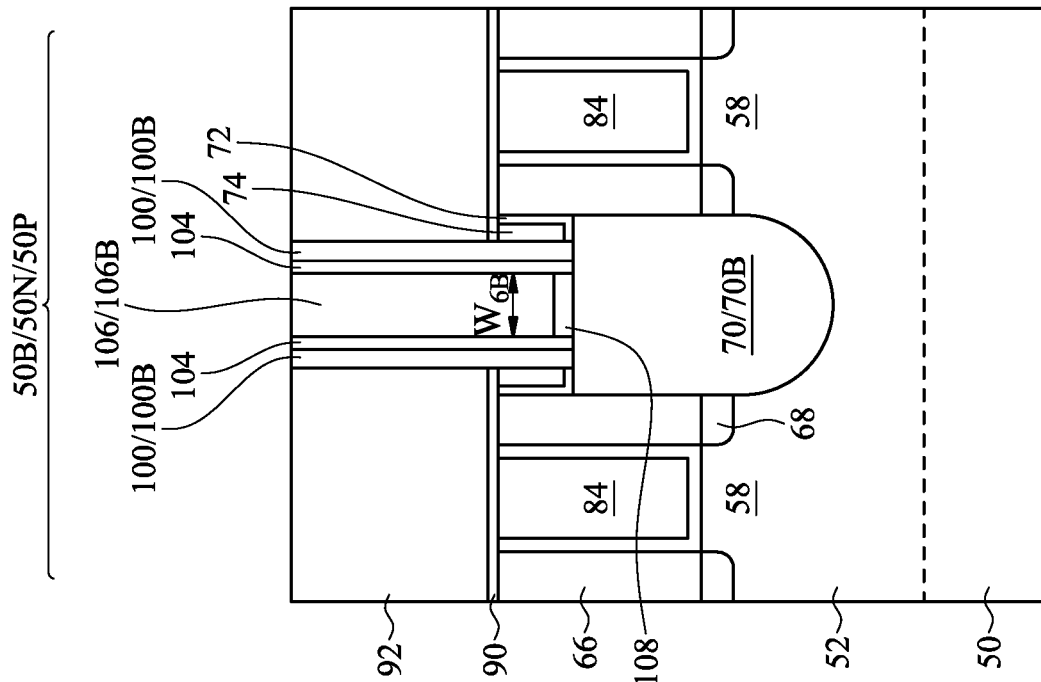
Figure 15B:
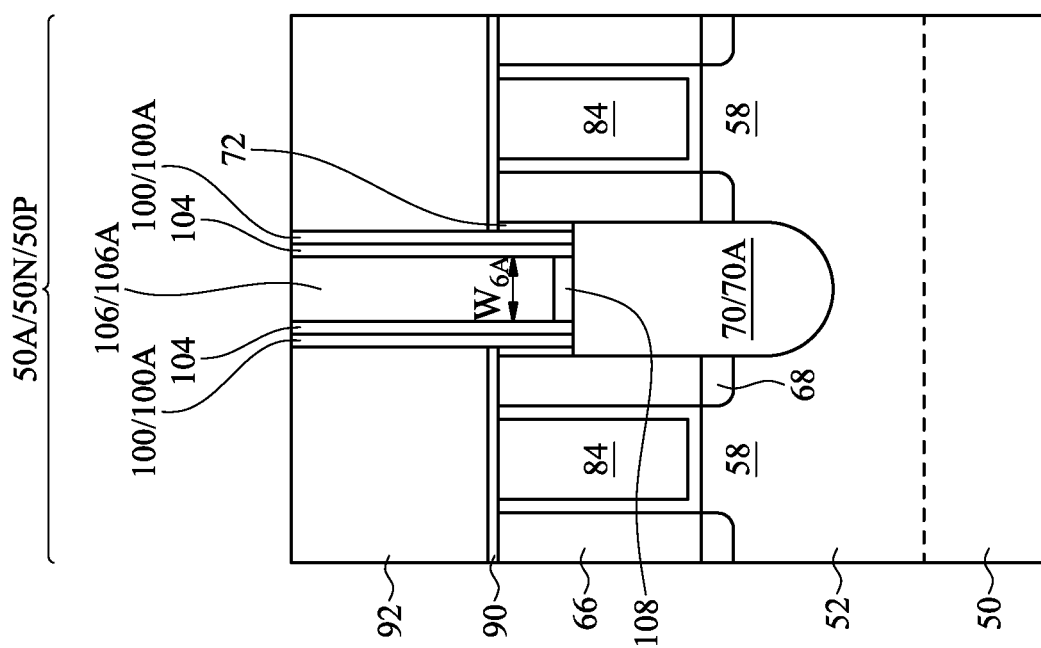

In FIGS. 15A and 15B, lower source/drain contacts 106 are formed in the contact openings 94. Silicides 108 may be formed on each of the epitaxial source/drain regions 70. The silicides 108 may be formed by depositing a conductive material in the contact openings 94 and performing an anneal. The conductive material can be titanium, titanium nitride, cobalt, nickel, the like, or combinations thereof. The silicides 108 are physically and electrically coupled to the epitaxial source/drain regions 70. A liner, such as a diffusion barrier layer, an adhesion layer, or the like, and a conductive material are then formed in the contact openings 94. The liner may include titanium, titanium nitride, tantalum, tantalum nitride, or the like, and is formed along the contact spacers 104. The conductive material may be cobalt, tungsten, ruthenium, aluminum, copper, silver, gold, nickel, or the like, and may be formed by deposition, plating, or the like. A planarization process, such as a CMP, may be performed to remove excess material from the top surface of the second ILD layer 92. The remaining liner and conductive material form the lower source/drain contacts 106. The lower source/drain contacts 106 can have substantially the same widths as the contact openings 94. For example, lower source/drain contacts 106A in the contact openings 94A can have the width $W_{6A}$, and lower source/drain contacts 106B in the contact openings 94B can have the width $W_{6B}$.

Figure 16A:
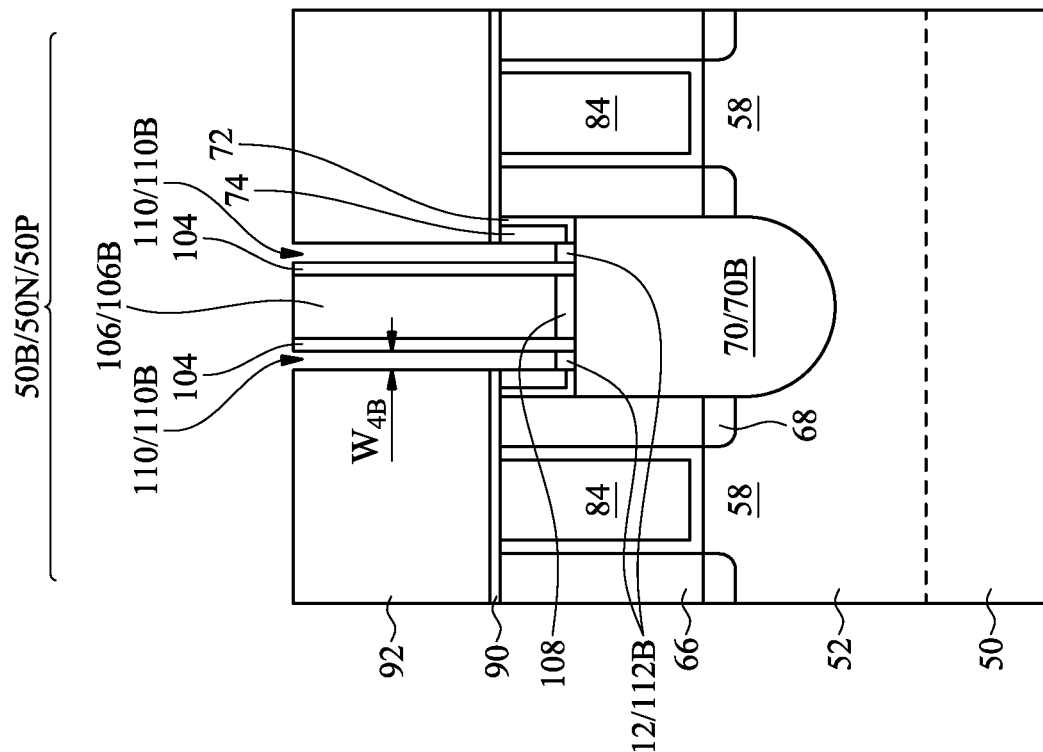
Figure 16B:
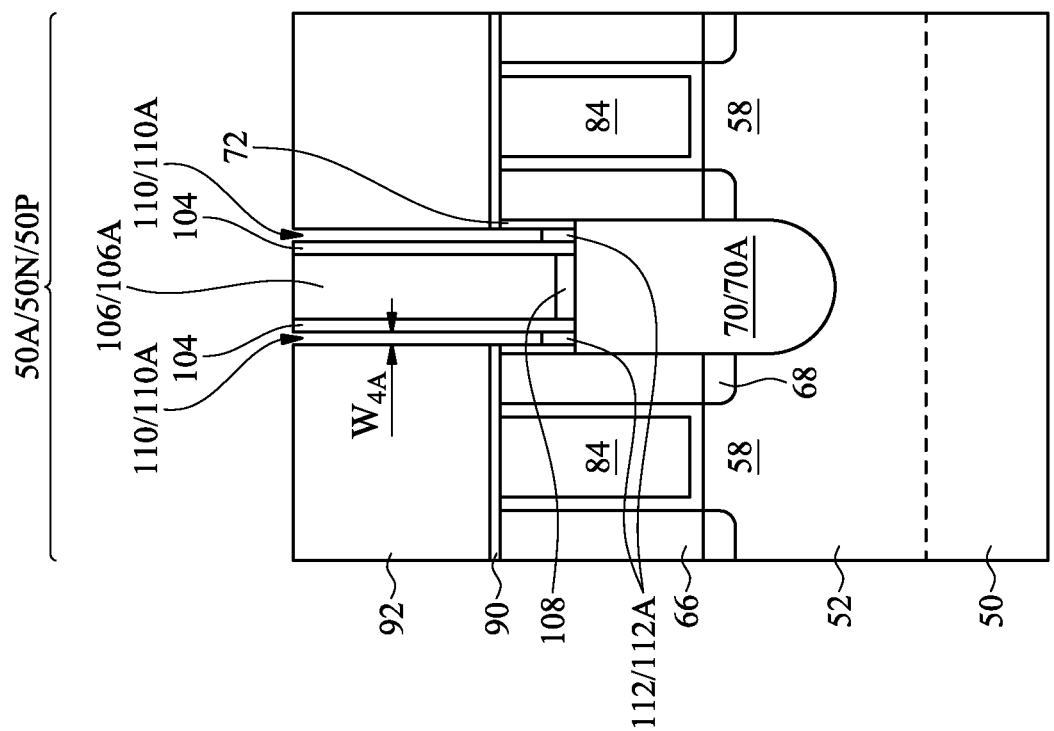
Figure 16C:
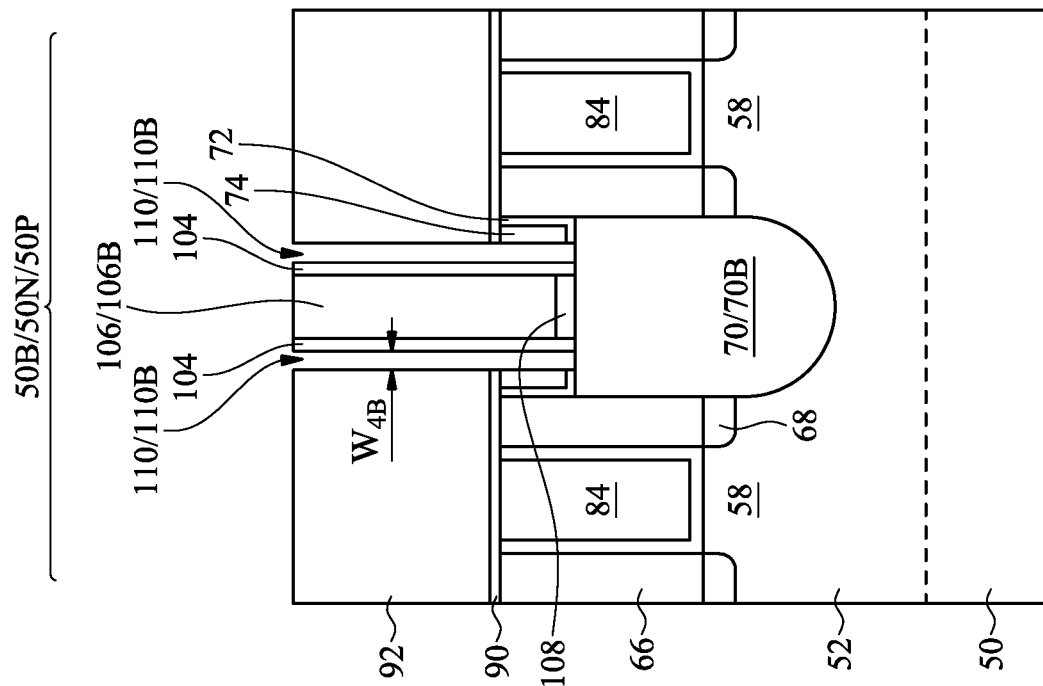
Figure 16D:
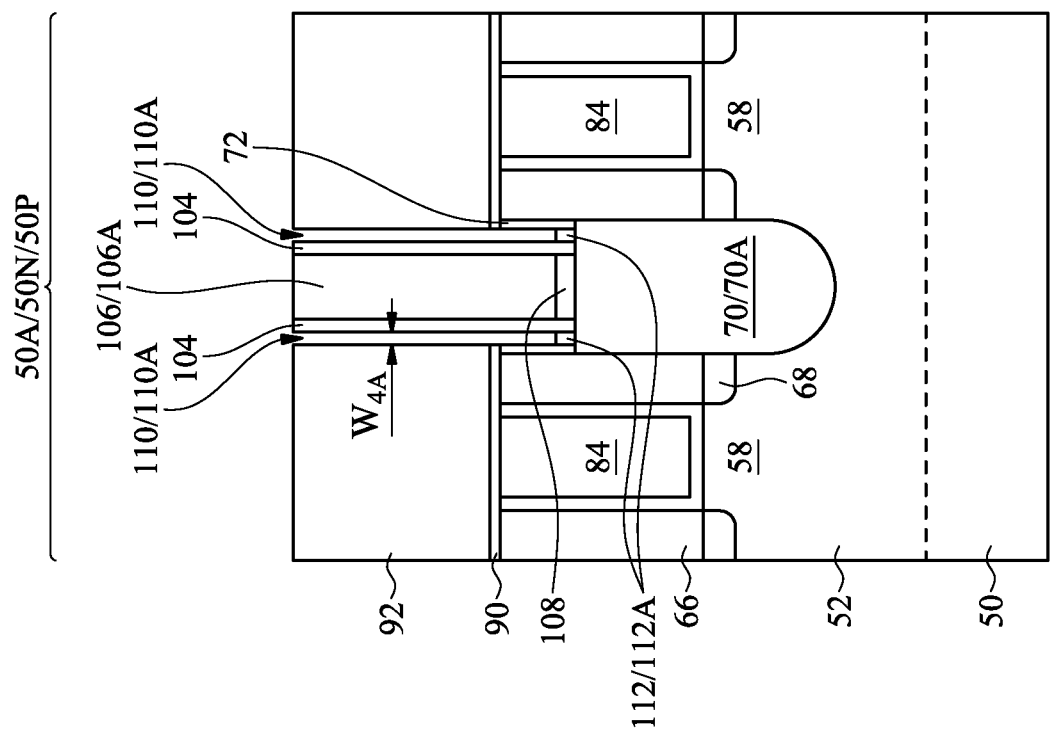
Figure 16F:
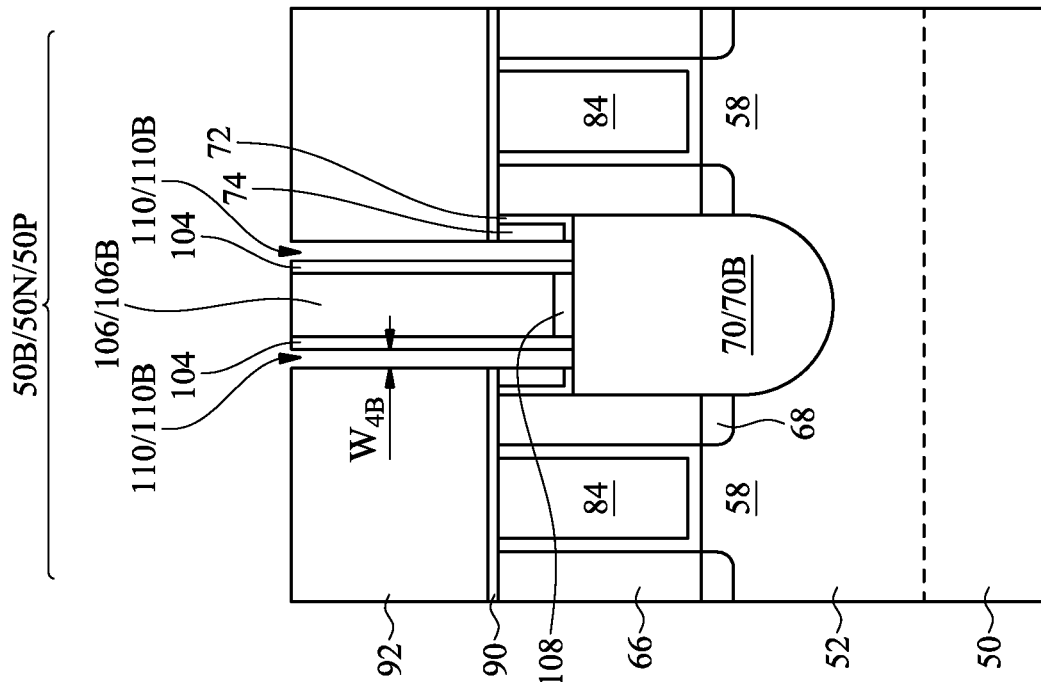
Figure 16E:
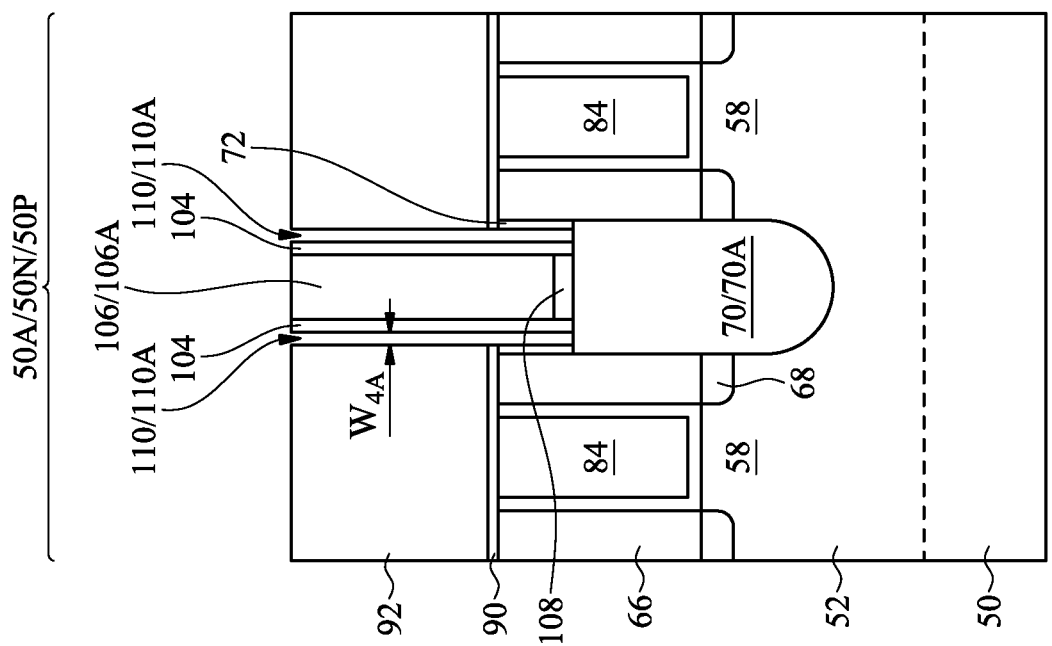

In FIGS. 16A and 16B, an etching process is performed to remove portions of the sacrificial spacers 100 and form voids 110 surrounding the lower source/drain contacts 106. The voids 110 are filled with a vacuum or air, both of which have a low relative permittivity. The voids 110 thus help electrically isolate the lower source/drain contacts 106 from the gate electrodes 84. The voids 110 can have substantially the same widths as the corresponding sacrificial spacers 100. For example, removal of the sacrificial spacers 100A forms voids 110A having the width $W_{4A}$, and removal of the sacrificial spacers 100B forms voids 110B having the width $W_{4B}$. The etching process may include a dry etch process using reaction gas(es) that selectively remove the material of the sacrificial spacers 100 at a greater rate than the materials of the lower source/drain contacts 106, contact spacers 104, second ILD layer 92, and CESL 72. In embodiments where the sacrificial spacers 100 are formed of undoped silicon and the contact spacers 104 and the etch stop layers 72 and 90 are formed of silicon nitride, the reaction gas(es) can include nitrogen trifluoride ($NF_3$), hydrogen, combinations thereof, or the like. In such embodiments the etching process can remove silicon from about 10 to about 3000 times faster than silicon nitride.

Some residual spacers 112 may remain in the lower portions of the voids 110 after the etching process. For example, the etching process can remove upper portions of the sacrificial spacers 100, with the residual spacers 112 comprising lower portions of the sacrificial spacers 100 remaining after the etching process. The residual spacers 112 physically contact the epitaxial source/drain regions 70. The residual spacers 112 can be formed of the material of the sacrificial spacers 100, or can be formed of a native oxide thereof. The heights of the residual spacers 112 depends on the widths $W_{4A}$ and $W_{4B}$ of the voids 110, with larger residual spacers 112 remaining in narrower voids 110 due to the narrower voids 110 accommodating a lesser volume of the reaction gas(es) for the etching process. The dimensions of the residual spacers 112 are discussed further below.

Formation of the residual spacers 112 is optional. In some embodiments, such as that shown in FIGS. 16C and 16D, residual spacers 112 are formed in narrower voids 110 (e.g., in the first region 50A) but not in wider voids 110 (e.g., in the second region 50B). In some embodiments, such as that shown in FIGS. 16E and 16F, no residual spacers 112 are formed.

In FIGS. 17A and 17B, a third ILD layer 122 is deposited over the second ILD layer 92. In some embodiment, the third ILD layer 122 is a flowable film formed by a flowable CVD method. In some embodiments, the third ILD layer 122 is formed of a dielectric material, such as PSG, BSG, BPSG, USG, or the like, and may be deposited by any suitable method, such as CVD and PECVD. An etch stop layer 120 is disposed between the third ILD layer 122 and the lower source/drain contacts 106, contact spacers 104, and second ILD layer 92. The etch stop layer 120 may be formed of a dielectric material, such as, silicon nitride, silicon oxide, silicon oxynitride, aluminum oxide, or the like, having a different etch rate than the material of the overlying third ILD layer 122, and may be formed by a suitable deposition process.

The etch stop layer 120 has portions partially filling upper portions of the voids 110. The voids 110 are thus sealed such that other materials may not be deposited in the voids 110 during subsequent processing. The amount of etch stop layer 120 formed in the voids 110 depends on the widths $W_{4A}$ and $W_{4B}$ of the voids 110, with less etch stop layer 120 being formed in smaller voids 110 due to the poor gap-filling properties of the smaller voids 110. For example, portions 120A of the etch stop layer 120 in the voids 110A can have a height $H_{1A}$ of up to about 3 nm, and portions 120B of the etch stop layer 120 in the voids 110B can have a height $H_{1B}$ of up to about 5 nm, with the height $H_{1B}$ being greater than the height $H_{1A}$. The portions 120A and 120B of the etch stop layer 120 in the voids 110 can help with the alignment of subsequently formed contacts (discussed further below), ensuring no contacts are formed in the voids 110. Remaining portions 120C of the etch stop layer 120 are disposed over the portions 120A and 120B of the etch stop layer 120, the lower source/drain contacts 106, the contact spacers 104, and the second ILD layer 92.

As noted above, some residual spacers 112 can remain in the structure. For example, residual spacers 112A in the first region 50A can have a height $H_{2A}$ of up to about 1 nm, and residual spacers 112B in the second region 50B can have a height $H_{2B}$ of up to about 1 nm, with the height $H_{2A}$ being greater than the height $H_{2B}$. The heights of the residual spacers 112 are small enough that a majority of the space between the lower source/drain contacts 106 and gate electrodes 84 is occupied by the voids 110. For example, the portions of the voids 110A between the lower source/drain contacts 106A and gate electrodes 84 can have a height $H_{3A}$ in the range of about 0.5 nm to about 2.5 nm, and the portions of the voids 110B between the lower source/drain contacts 106B and gate electrodes 84 can have a height $H_{3B}$ in the range of about 3.5 nm to about 8.5 nm, with the height $H_{3B}$ being greater than the height $H_{3A}$. The heights $H_{2A}$ and $H_{2B}$ are small, such as less than half of the heights $H_{3A}$ and $H_{3B}$, respectively. In other words, the distances between the topmost surfaces of the epitaxial source/drain regions 70 and the topmost surfaces of the residual spacers 112 are less than the distances between the topmost surfaces of the residual spacers 112 and the topmost surfaces of the gate electrodes 84. The voids 110 provide more electrical isolation than the residual spacers 112, and so forming the residual spacers 112 to small heights $H_{2A}$ and $H_{2B}$ helps provide a large amount of electrical isolation between the lower source/drain contacts 106 and gate electrodes 84, thus decreasing the parasitic capacitance of the resulting FinFETs.

After the processes described above, the contact spacers 104 and lower source/drain contacts 106 collectively have three portions, each portion being surrounded by a different dielectric material. Upper portions of the contact spacers 104 and lower source/drain contacts 106 are surrounded by portions of the etch stop layer 120 (e.g., silicon nitride). Middle portions of the contact spacers 104 and lower source/drain contacts 106 are surrounded by the voids 110 (e.g., air). Lower portions of the contact spacers 104 and lower source/drain contacts 106 are surrounded by the residual spacers 112 (e.g., undoped silicon).

In FIGS. 18A and 18B, upper source/drain contacts 124 and gate contacts 126 are formed. Openings for the upper source/drain contacts 124 are formed through the third ILD layer 122 and etch stop layer 120, and openings for the gate contacts 126 are formed through the ILD layers 92 and 122 and the etch stop layers 90 and 120. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, silver, gold, tungsten, cobalt, aluminum, nickel, or the like. A planarization process, such as a CMP, may be performed to remove excess material from a top surface of the third ILD layer 122. The remaining liner and conductive material form the upper source/drain contacts 124 and gate contacts 126 in the openings. The upper source/drain contacts 124 are physically and electrically coupled to the lower source/drain contacts 106, and the gate contacts 126 are physically and electrically coupled to the gate electrodes 84. The upper source/drain contacts 124 and gate contacts 126 may be formed in different processes, or may be formed in the same process. Although shown as being formed in the same cross-sections, it should be appreciated that each of the upper source/drain contacts 124 and gate contacts 126 may be formed in different cross-sections, which may avoid shorting of the contacts.

Forming the etch stop layer 120 with the portions 120A and 120B extending into the voids 110 can help ensure no upper source/drain contacts 124 are formed in the voids 110. In some embodiments, such as that shown in FIGS. 18C and 18D, the upper source/drain contacts 124 can shift or be formed to inconsistent widths. When such shifting occurs, the upper source/drain contacts 124 extend into, but not through, the portions 120A and 120B of the etch stop layer 120. As such, no breaching of the voids 110 occurs, thus increasing the electrical isolation of the lower source/drain contacts 106.

Embodiments may achieve advantages. Forming the sacrificial spacers 100 by a CVD process allows the sacrificial spacers 100 to be formed to non-uniform widths, with wider sacrificial spacers 100 being formed in wider contact openings 94. Variation in the widths $W_{6A}$ and $W_{6B}$ of the lower source/drain contacts 106 may thus be reduced in a self-adjusting manner. The dimensions of the lower source/drain contacts 106 may thus be adjusted to desired values without the need for tooling optimization. The effects of masking errors and/or topography variations may also be reduced, increasing the manufacturing yield of the resulting FinFETs.

Figures 19A, 19B:
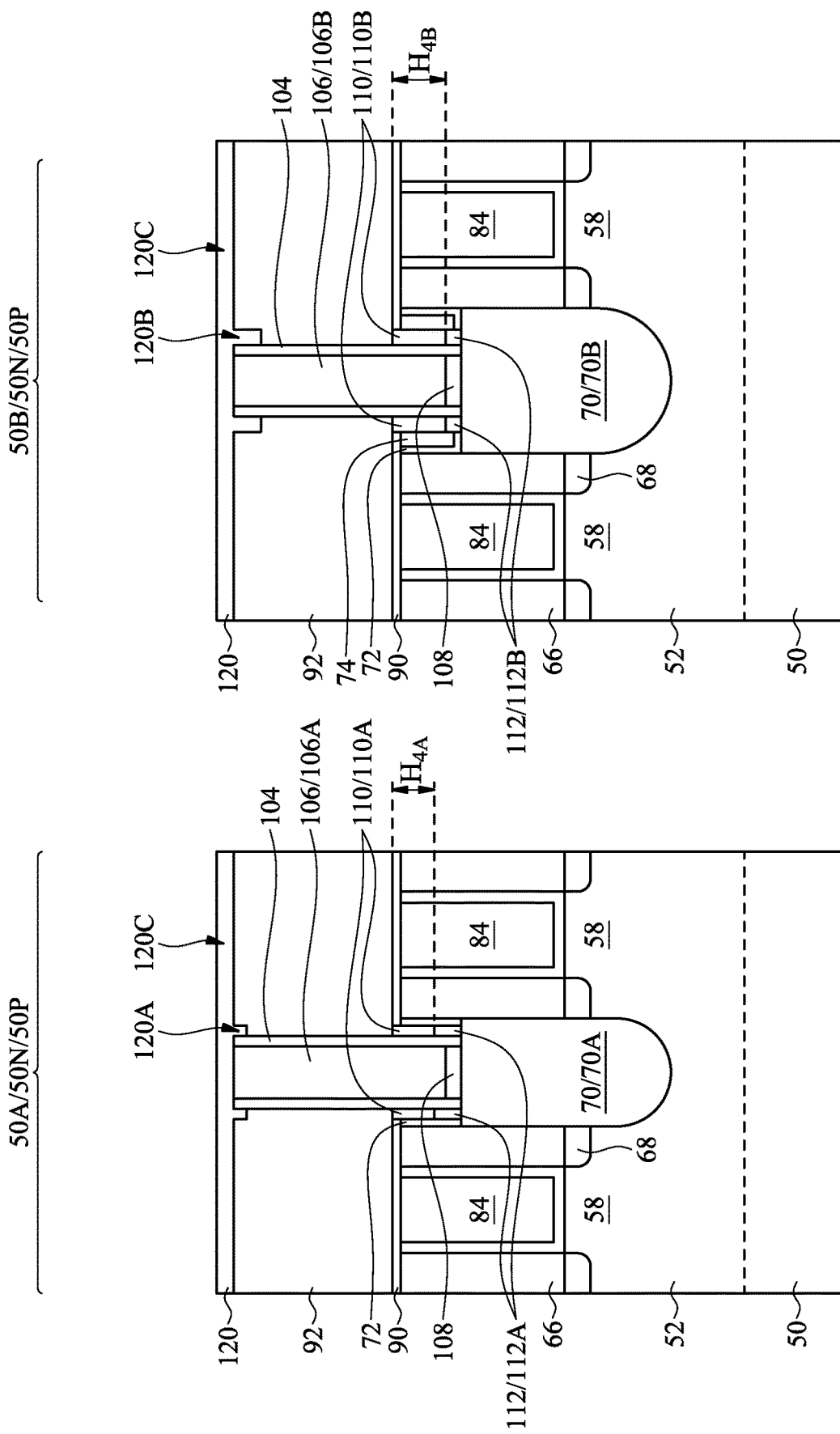

FIGS. 19A through 20B are cross-sectional views of intermediate stages in the manufacturing of FinFETs, in accordance with some other embodiments. FIGS. 19A, 19B, 20A, and 20B are cross-sectional views illustrated along reference cross-section A-A in FIG. 1, except only one source/drain region 70 is shown. FIGS. 19A and 20A illustrate the first region 50A, and FIGS. 19B and 20B illustrate the second region 50B.

In FIGS. 19A and 19B, an intermediate structure similar to that of FIGS. 16A and 16B is obtained. The etch stop layer 120 is then deposited on the lower source/drain contacts 106, contact spacers 104, and second ILD layer 92, in a similar manner as that discussed above with respect to FIGS. 17A and 17B. For example, the etch stop layer 120 has portions 120A and 120B extending along the sidewalls of the contact spacers 104.

After the etch stop layer 120 is deposited, the second ILD layer 92 is expanded to contact sidewalls of the contact spacers 104 and sidewalls of the portions 120A and 120B of the etch stop layer 120. Expanding the second ILD layer 92 shrinks the voids 110. The voids 110A and 110B thus have reduced heights $H_{4A}$ and $H_{4B}$, respectively, with the height $H_{4B}$ being greater than the height $H_{4A}$. For example, the height $H_{4A}$ can be in the range of about 0.5 nm to about 2.5 nm, and the height $H_{4B}$ can be in the range of about 3.5 nm to about 8.5 nm.

In some embodiments, the second ILD layer 92 is expanded by implanting the second ILD layer 92 with an impurity such as Ge, B, Ar, Sn, Si, or the like. The second ILD layer 92 may be implanted to have an impurity concentration of in a range from about $10^{14}$ cm$^{-3}$ to about $10^{16}$ cm$^{-3}$. The implanting may be performed at a high energy, such as between about 30 keV and about 40 keV, so that the impurities pass through the etch stop layer 120 and implant in the second ILD layer 92. Implanting the second ILD layer 92 with an impurity may increase the volume of the second ILD layer 92, thus causing it to expand. The second ILD layer 92 may thus have a decreased density after the implanting.

In FIGS. 20A and 20B, the third ILD layer 122 is deposited on the etch stop layer 120. The third ILD layer 122 can be deposited in a similar manner as that discussed above with respect to FIGS. 17A and 17B. The upper source/drain contacts 124 and gate contacts 126 are then formed extending through the third ILD layer 122, etch stop layer 120, and second ILD layer 92. The upper source/drain contacts 124 and gate contacts 126 can be formed in a similar manner as that discussed above with respect to FIGS. 18A and 18B.

In an embodiment, a method includes: etching a first contact opening through one or more inter-layer dielectric (ILD) layers over a first epitaxial source/drain region; depositing a first sacrificial spacer along first sidewalls of the ILD layers in the first contact opening; depositing a first contact spacer along a sidewall of the first sacrificial spacer in the first contact opening; forming a first source/drain contact along a sidewall of the first contact spacer in the first contact opening, the first source/drain contact connected to the first epitaxial source/drain region; and after depositing the first source/drain contact, removing a portion of the first sacrificial spacer to form a first void between the sidewall of the first contact spacer and the first sidewalls of the ILD layers. In some embodiments of the method, depositing the first sacrificial spacer includes: depositing a sacrificial spacer layer in the first contact opening with a first deposition process; and removing horizontal portions of the sacrificial spacer layer, the first sacrificial spacer including vertical portions of the sacrificial spacer layer remaining in the first contact opening. In some embodiments of the method, depositing the first contact spacer includes: depositing a contact spacer layer in the first contact opening with a second deposition process, the second deposition process having greater uniformity than the first deposition process; and removing horizontal portions of the contact spacer layer, the first contact spacer including vertical portions of the contact spacer layer remaining in the first contact opening. In some embodiments of the method, the first deposition process is chemical vapor deposition, and the second deposition process is atomic layer deposition. In some embodiments of the method, removing the portion of the first sacrificial spacer includes: etching an upper portion of the first sacrificial spacer with an etching process, the etching process removing a material of the first sacrificial spacer at a greater rate than a material of the first contact spacer. In some embodiments of the method, the etching process forms a residual spacer including a lower portion of the first sacrificial spacer remaining after the etching process. In some embodiments of the method, the first epitaxial source/drain region is disposed adjacent a gate electrode, a first distance between a topmost surface of the first epitaxial source/drain region and a topmost surface of the residual spacer being less than a second distance between the topmost surface of the residual spacer and a topmost surface of the gate electrode. In some embodiments, the method further includes: etching a second contact opening through the ILD layers over a second epitaxial source/drain region, the second contact opening having a greater width than the first contact opening; depositing a second sacrificial spacer along second sidewalls of the ILD layers in the second contact opening, the second sacrificial spacer having a greater width than the first sacrificial spacer; depositing a second contact spacer along a sidewall of the second sacrificial spacer in the second contact opening, the second contact spacer and the first contact spacer having a same width; forming a second source/drain contact along a sidewall of the second contact spacer in the second contact opening, the second source/drain contact connected to the second epitaxial source/drain region; and while removing the portion of the first sacrificial spacer, removing a portion of the second sacrificial spacer to form a second void between the sidewall of the second contact spacer and the second sidewalls of the ILD layers. In some embodiments, the method further includes: depositing a first dielectric layer over the ILD layers, in an upper portion of the first void, and in an upper portion of the second void, portions of the first dielectric layer in the first void having a first height, portions of the first dielectric layer in the second void having a second height, the first height being less than the second height. In some embodiments, the method further includes: after depositing the first dielectric layer, expanding at least one of the ILD layers to shrink the void, the expanding including implanting an impurity in at least one of the ILD layers.

In an embodiment, a device includes: a gate electrode; a epitaxial source/drain region adjacent the gate electrode; one or more inter-layer dielectric (ILD) layers over the epitaxial source/drain region; a first source/drain contact extending through the ILD layers, the first source/drain contact connected to the epitaxial source/drain region; a contact spacer surrounding the first source/drain contact; and a void disposed between the contact spacer and the ILD layers. In some embodiments, the device further includes: a first spacer disposed between the contact spacer and the ILD layers, the first spacer contacting the epitaxial source/drain region. In some embodiments of the device, a first distance between a topmost surface of the epitaxial source/drain region and a topmost surface of the first spacer is less than a second distance between the topmost surface of the first spacer and a topmost surface of the gate electrode. In some embodiments, the device further includes: a first dielectric layer having a first portion and a second portion, the first portion disposed over the ILD layers, the contact spacer, and the first source/drain contact, the second portion disposed between the contact spacer and the ILD layers, the void disposed over the first spacer and under the first dielectric layer. In some embodiments of the device, the void is disposed over the first spacer and under the first dielectric layer.

In an embodiment, a device includes: a semiconductor substrate; a first epitaxial source/drain region in the semiconductor substrate; a second epitaxial source/drain region in the semiconductor substrate; one or more inter-layer dielectric (ILD) layers over the first epitaxial source/drain region and the second epitaxial source/drain region; a first source/drain contact extending through the ILD layers, the first source/drain contact connected to the first epitaxial source/drain region; a first contact spacer surrounding the first source/drain contact; a first void disposed between the first contact spacer and the ILD layers; a second source/drain contact extending through the ILD layers, the second source/drain contact connected to the second epitaxial source/drain region; a second contact spacer surrounding the second source/drain contact, the second contact spacer and the first contact spacer having a same width; and a second void disposed between the second contact spacer and the ILD layers, the second void having a greater width than the first void.

In some embodiments, the device further includes: a first spacer disposed between the first contact spacer and the ILD layers, the first void disposed over the first spacer, the first spacer and the first void having a same width; and a second spacer disposed between the second contact spacer and the ILD layers, the second void disposed over the second spacer, the second spacer and the second void having a same width. In some embodiments of the device, the first spacer has a greater height than the second spacer. In some embodiments of the device, the first spacer and the second spacer have a greater etch rate than the first contact spacer and the second contact spacer relative an etching process. In some embodiments, the device further includes: a first dielectric layer having a first portion, a second portion, and a third portion, the first portion disposed between the first contact spacer and the ILD layers, the second portion disposed between the second contact spacer and the ILD layers, the third portion disposed over the first portion and the second portion. In some embodiments of the device, the second portion of the first dielectric layer has a greater height than the first portion of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first source/drain region in a substrate;
   a second source/drain region in the substrate;
   a first inter-layer dielectric over the first source/drain region and the second source/drain region;
   a first source/drain contact extending through the first inter-layer dielectric, the first source/drain contact connected to the first source/drain region, the first source/drain contact having a first width;
   a first spacer around the first source/drain contact;
   a first void between the first spacer and first sidewalls of the first inter-layer dielectric, the first sidewalls of the first inter-layer dielectric separated by a first distance;
   a second source/drain contact extending through the first inter-layer dielectric, the second source/drain contact connected to the second source/drain region, the second source/drain contact having a second width, the second width less than the first width;
   a second spacer around the second source/drain contact, the second spacer having a same width as the first spacer; and
   a second void between the second spacer and second sidewalls of the first inter-layer dielectric, the second sidewalls of the first inter-layer dielectric separated by a second distance,
   wherein a first difference between the first distance and the first width is greater than a second difference between the second distance and the second width.

2. The device of claim 1, wherein a first height of the first void is different from a second height of the second void.

3. The device of claim 1, wherein the first void has a greater width than the second void.

4. The device of claim 1 further comprising:
   a second inter-layer dielectric over the first inter-layer dielectric, the first source/drain contact and the second source/drain contact extending through the second inter-layer dielectric, the second inter-layer dielectric contacting first sidewalls of the first spacer and second sidewalls of the second spacer.

5. The device of claim 4, wherein a bottom surface of the second inter-layer dielectric is exposed to the first void and to the second void.

6. The device of claim 4, wherein the second inter-layer dielectric comprises an impurity having a concentration of in a range of $10^{14}$ cm$^{-3}$ to $10^{16}$ cm$^{-3}$, the impurity comprising Ge, B, Ar, Sn, or Si.

7. A device comprising:
   a gate electrode;
   a source/drain region adjacent the gate electrode;
   a first inter-layer dielectric over the source/drain region;
   a second inter-layer dielectric over the first inter-layer dielectric;
   a source/drain contact extending through the first inter-layer dielectric and the second inter-layer dielectric, the source/drain contact connected to the source/drain region;
   a contact spacer surrounding the source/drain contact, the second inter-layer dielectric contacting a sidewall of the contact spacer; and
   a void disposed between the sidewall of the contact spacer and the first inter-layer dielectric, a bottom surface of the second inter-layer dielectric exposed to the void.

8. The device of claim 7 further comprising:
   a first spacer disposed between the contact spacer and the first inter-layer dielectric, the first spacer contacting the source/drain region, the void disposed over the first spacer.

9. The device of claim 8, wherein a first distance between a top surface of the source/drain region and a top surface of the first spacer is less than a second distance between the top surface of the first spacer and a top surface of the gate electrode.

10. The device of claim 7 further comprising:
    a first dielectric layer having a first portion and a second portion, the first portion disposed over the second inter-layer dielectric, the contact spacer, and the source/drain contact, the second portion disposed between the sidewall of the contact spacer and the second inter-layer dielectric.

11. The device of claim 7, wherein the second inter-layer dielectric comprises an impurity having a concentration of in a range of $10^{14}$ cm$^{-3}$ to $10^{16}$ cm$^{-3}$, the impurity comprising Ge, B, Ar, Sn, or Si.

12. A device comprising:
    a first source/drain region in a semiconductor substrate;
    a second source/drain region in the semiconductor substrate;
    an inter-layer dielectric over the first source/drain region and the second source/drain region;
    a first source/drain contact extending through the inter-layer dielectric, the first source/drain contact connected to the first source/drain region;
    a first contact spacer surrounding the first source/drain contact;
    a first void disposed between the first contact spacer and the inter-layer dielectric;
    a second source/drain contact extending through the inter-layer dielectric, the second source/drain contact connected to the second source/drain region;
    a second contact spacer surrounding the second source/drain contact, the second contact spacer and the first contact spacer having a same width; and
    a second void disposed between the second contact spacer and the inter-layer dielectric, the second void having a greater width than the first void.

13. The device of claim 12 further comprising:
a first spacer disposed between the first contact spacer and the inter-layer dielectric, the first void disposed over the first spacer, the first spacer and the first void having a same width; and
a second spacer disposed between the second contact spacer and the inter-layer dielectric, the second void disposed over the second spacer, the second spacer and the second void having a same width.

14. The device of claim 13, wherein the first spacer has a greater height than the second spacer.

15. The device of claim 13, wherein the first spacer and the second spacer have a greater etch rate than the first contact spacer and the second contact spacer relative an etching process.

16. The device of claim 12 further comprising:
a first spacer disposed between the first contact spacer and the inter-layer dielectric, the first void disposed over the first spacer, the first spacer and the first void having a same width, wherein a top surface of the second source/drain region is exposed to the second void.

17. The device of claim 16, wherein the first spacer has a greater etch rate than the first contact spacer and the second contact spacer relative an etching process.

18. The device of claim 12, wherein a top surface of the first source/drain region is exposed to the first void, and a top surface of the second source/drain region is exposed to the second void.

19. The device of claim 12 further comprising:
a first dielectric layer having a first portion, a second portion, and a third portion, the first portion disposed between the first contact spacer and the inter-layer dielectric, the second portion disposed between the second contact spacer and the inter-layer dielectric, the third portion disposed over the first portion and the second portion.

20. The device of claim 19, wherein the second portion of the first dielectric layer has a greater height than the first portion of the first dielectric layer.

* * * * *